United States Patent [19]
Suzuki et al.

[11] Patent Number: 5,654,952
[45] Date of Patent: Aug. 5, 1997

[54] DIGITAL SIGNAL ENCODING METHOD AND APPARATUS AND RECORDING MEDIUM

[75] Inventors: Hiroshi Suzuki, Saitama; Kuniaki Takahashi, Tokyo, both of Japan

[73] Assignee: Sony Corporation, Tokyo, Japan

[21] Appl. No.: 547,954

[22] Filed: Oct. 25, 1995

[30] Foreign Application Priority Data

Oct. 28, 1994 [JP] Japan .................... 6-265013

[51] Int. Cl.$^6$ .............................. G11B 7/00; G11B 5/09; G10L 3/02
[52] U.S. Cl. ........................ 369/124; 369/47; 395/2.91
[58] Field of Search .................... 369/47, 48, 54, 369/86, 59, 60, 124; 360/53, 32, 48; 395/2.13, 2.37, 2.38; 381/30, 36, 37, 29, 41, 34; 341/50, 51, 54, 64

[56] References Cited

U.S. PATENT DOCUMENTS

| | | | |
|---|---|---|---|
| 4,485,337 | 11/1984 | Sandusky | 318/314 |
| 4,669,120 | 5/1987 | Ono | 381/40 |
| 4,908,810 | 3/1990 | Oie | 369/50 |
| 4,972,484 | 11/1990 | Theile | 381/37 |
| 5,040,217 | 8/1991 | Brandenburg | 381/47 |
| 5,045,812 | 9/1991 | Tateishi | 331/10 |
| 5,063,550 | 11/1991 | Watari et al. | 369/44.36 |
| 5,109,417 | 4/1992 | Fielder | 381/36 |
| 5,204,677 | 4/1993 | Akagiri et al. | 341/118 |
| 5,243,588 | 9/1993 | Maeda et al. | 369/54 |
| 5,260,980 | 11/1993 | Akagiri et al. | 375/122 |
| 5,301,205 | 4/1994 | Tsutsui et al. | 375/1 |
| 5,301,255 | 4/1994 | Nagai et al. | 395/2.1 X |
| 5,311,561 | 5/1994 | Akagiri | 375/122 |
| 5,381,143 | 1/1995 | Shimoyoshi et al. | 341/51 |
| 5,454,011 | 9/1995 | Shimoyoshi | 381/29 X |
| 5,461,378 | 10/1995 | Shimoyoshi et al. | 341/51 |
| 5,490,170 | 2/1996 | Akagiri et al. | 381/30 X |
| 5,548,574 | 8/1996 | Shimoyoshi et al. | 369/124 |

FOREIGN PATENT DOCUMENTS 39 33974 A1  4/1990  Germany .

OTHER PUBLICATIONS

Patent Abstract of Japan, vol. 14, No. 525 (P–1132) Nov. 19, 1990 & JP–A–22 20 271 (Pioneer Electronic Corporation) Sep. 3, 1990 *abstract*.

*Primary Examiner*—P. W. Huber
*Attorney, Agent, or Firm*—Limbach & Limbach L.L.P.

[57] ABSTRACT

A digital signal compressing device includes a unit for dividing an input signal into plural bands duping information compression, a unit for producing frequency-domain data of the input signal divided into plural bands, and a unit for operating on frequency-domain characteristics. The unit for operating on frequency-domain characteristics operates on the frequency-domain characteristics so that the condition of canceling the aliasing noise by the frequency division and subsequent frequency synthesis performed by a synthesis filter in association with the division at the time of information expansion will be maintained. The frequency-domain characteristics of the input signal can be acted on easily without obstructing the condition of canceling the aliasing noise without requiring a new mechanism or device other than the information compressing mechanism or device.

22 Claims, 16 Drawing Sheets

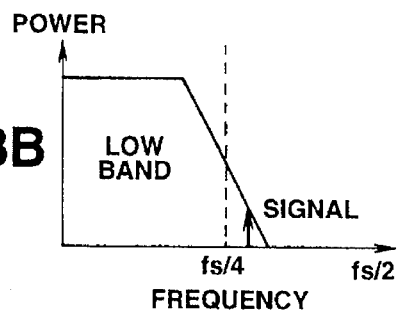
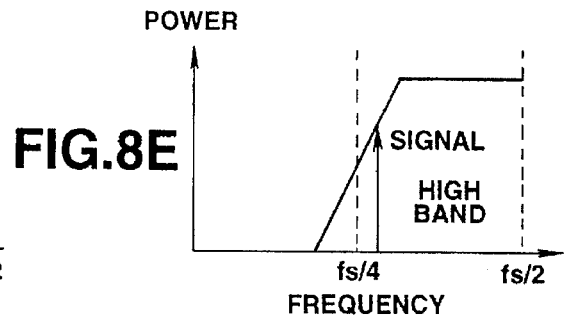
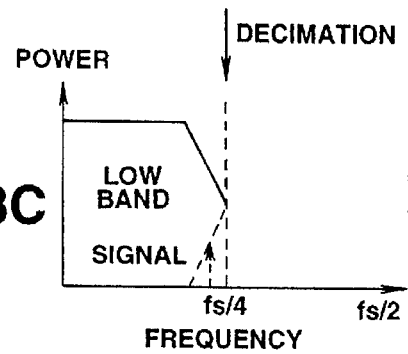
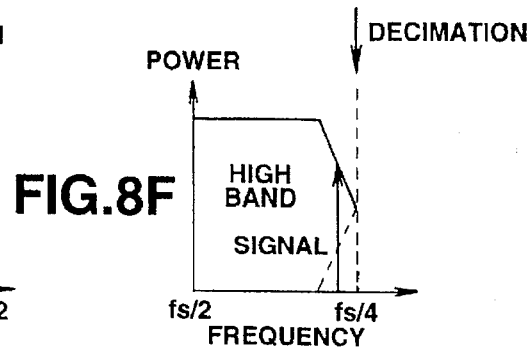
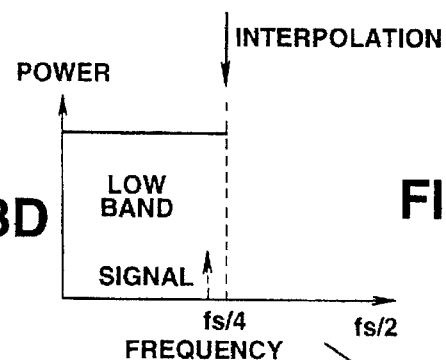
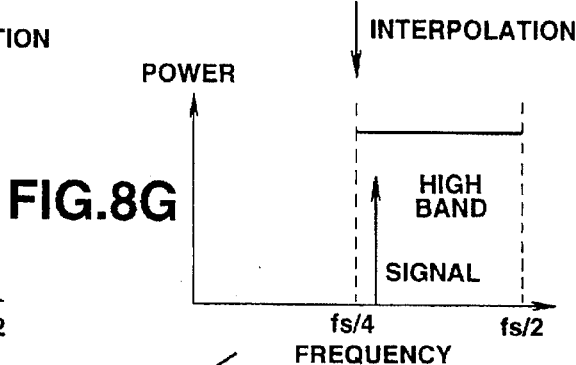
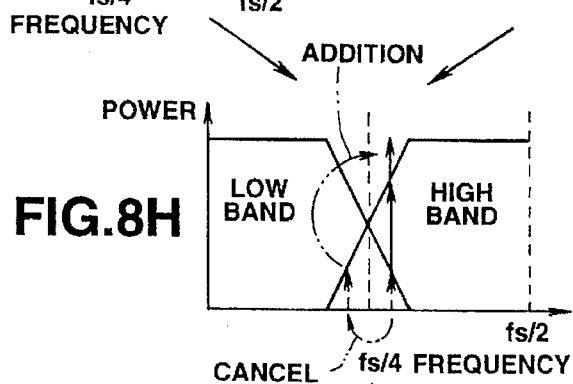
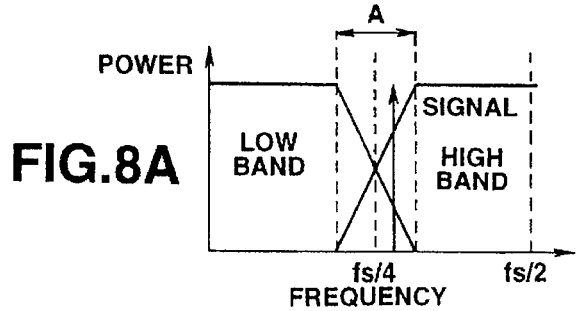

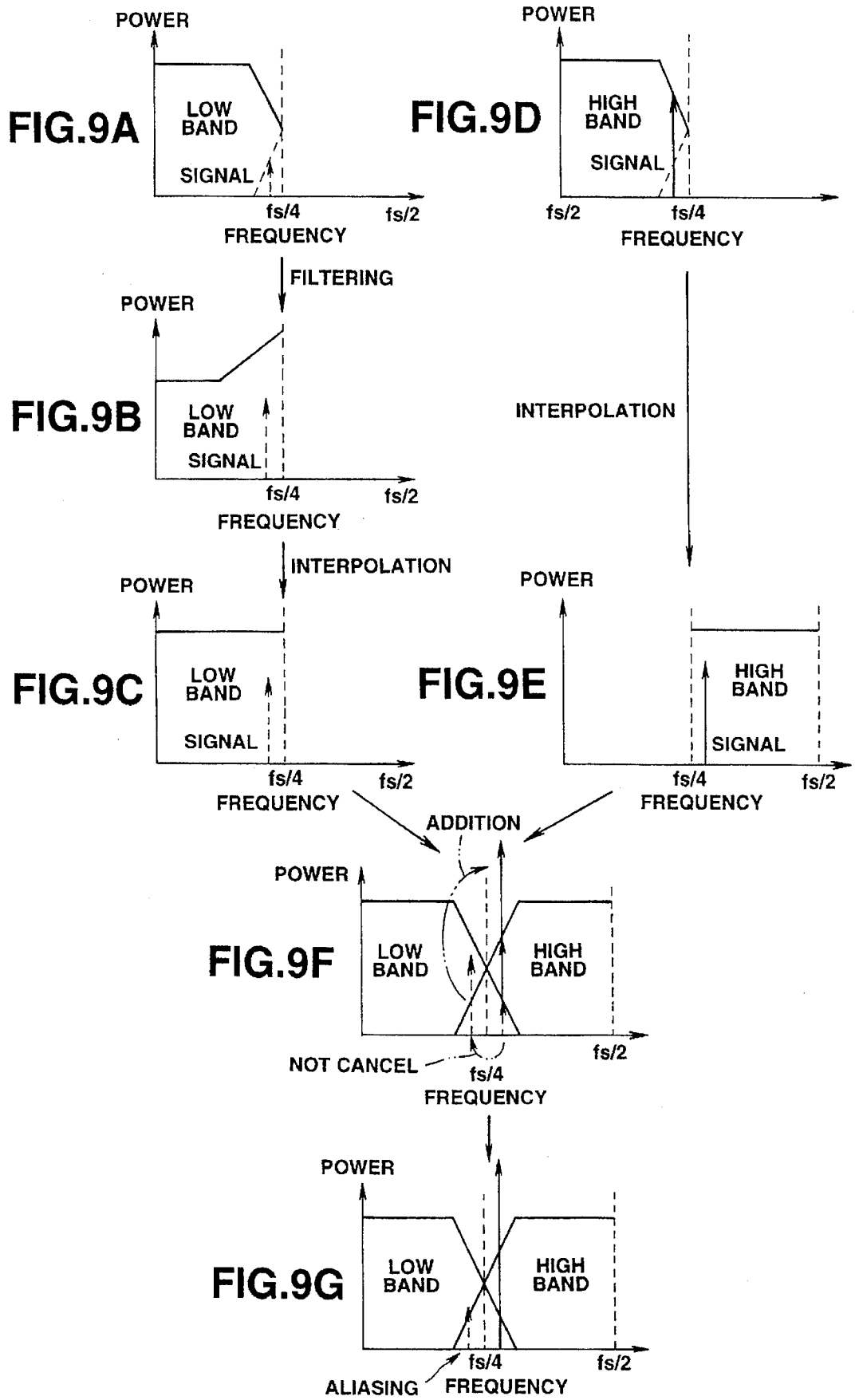

DIGITAL SIGNAL ENCODING METHOD AND APPARATUS AND RECORDING MEDIUM

BACKGROUND OF THE INVENTION

This invention relates to recording/reproduction of encoded data (compressed data) obtained on bit compression of digital audio signals, a recording medium on which the encoded data are recorded, and a transmission system for the encoded data. More particularly, it relates a method and apparatus for encoding (compressing) digital data in which the frequency-based size of mini-blocks for bit allocation for floating and/or encoding for information compression, subdivided in time and frequency, is changed based upon changes in the input signal on the frequency axis, and a recording medium having encoded (compressed) signals recorded thereon.

The present Assignee has already proposed in e.g., the U.S. Pat. No. 5,243,588 a technique of bit-compressing input digital audio data for burst-like recording the resulting data in terms of a pre-set amount of data as a recording unit.

This technique records/reproduces adaptive differential PCM (ADPCM) as prescribed in audio data formats of the so-called CD-Interactive (CD-I) or CD-ROM XA, using a magneto-optical disc as a recording medium. The PCM audio data are recorded in a burst-like fashion on the magneto-optical disc, in terms of e.g., 32 sectors of the ADPCM data and a few linking sectors for interleaving as a recording unit.

Several modes may be selected for the ADPCM audio for the recording/reproducing apparatus employing the magneto-optical disc. For example, based upon the playback time for the usual CD, a level A with a compression factor of 2 and a sampling frequency of 37.8 kHz, a level B with a compression factor of 4 and a sampling frequency of 37.8 kHz and a level C with a compression factor of 8 and a sampling frequency of 8.9 kHz, are prescribed. For example, with the level B, digital audio data are compressed to approximately ¼ such that the play time of the disc recorded with the mode of the level B is four times that of the disc of the standard CD format (CD-DA format). Since the recording/play time substantially as long as that of the standard 12 cm disc may be achieved, the apparatus may be reduced in size.

However, since the rotational velocity of the disc is the same as that of the standard CD, compressed data corresponding to the four-fold play time can be obtained per pre-set time for the level B. Thus the same compressed data is read in quadruplicates with time units e.g., of sectors or clusters. Only one of the quadruplicate readouts of the compressed data is passed to audio reproduction. Specifically, when scanning or tracking a spirally extending recording track, the same track is repeatedly tracked four times by effecting track jump of reverting to the original track position per each rotation in executing the playback operation. This means that it suffices to obtain normal compressed data for only one of the quadruplicate readout operations. Thus the above arrangement is desirably applied to a portable small-sized equipment which is strong against errors such as disturbances.

For compressing digital data by utilizing the above technique, it is effective to utilize psychoacoustic characteristics of the human hearing sense, that is the so-called masking effects or minimum audibility characteristics, for achieving efficient compression. For exploiting these psychoacoustic characteristics, it is necessary to analyze the input signal according to its respective frequency areas. To this end, orthogonal transform and/or a frequency-dividing filter is employed. The frequency-domain spectral data resulting from the orthogonal transform or data divided into at least two areas by the frequency-dividing filter may be handled as frequency-domain data. Thus the above technique may be utilized for changing the signal characteristics on the frequency domain, power representation on the frequency basis or representation of so-called spectrum analyzer without the necessity of adding a system or devices.

In the present specification, spectral data are frequency-domain data obtained on orthogonal transform by MDCT. However, the MDCT is given only for illustration and is not intended as limiting the invention. Thus the data obtained on fast Fourier transform FFT, discrete Fourier transform (DFT) or discrete cosine transform (DCT), and spectral data divided in frequency by a band-pass filter, such as a quadrature mirror filter (QMF), are collectively termed spectral data.

With the above-described technique of producing frequency-domain data using the above frequency-dividing filter, it is a usual practice to divide signals into frequency bands and thin Out data by decimation for preventing the number of data from being increased. Although the data decimation produces aliasing noise due to non-ideal characteristics of the frequency-dividing filter, this aliasing noise usually is not inconvenient if a synthesis filter for decoding the encoded data is selected for satisfying the condition of canceling the aliasing noise.

However, if the frequency-domain data are directly employed by operating on frequency-domain characteristics as described above, the condition of canceling the aliasing noise is not met. The result is that the decoded music data contains the aliasing noise thus raising problems in connection with psychoacoustic characteristics of the human hearing system, that is deterioration in the sound quality. Since the aliasing noise is basically produced by incompleteness in division or defect in the synthesis filter, the number of orders of the filter may be increased for approaching the filter characteristics to those of a an ideal filter for eliminating the effect of the aliasing noise. However, the amount of the arithmetic operations in this case is voluminous and is not desirable from the viewpoint of practical circuit scale.

OBJECT AND SUMMARY OF THE INVENTION

It is therefore an object of the present invention to provide a method and a device for compressing digital signals using a band-splitting filter for information encoding (compression) and a band-synthesizing filter for information decoding (expansion), in which a technique of acting on frequency-domain characteristics is applied in such a manner as not to obstruct the condition of canceling the aliasing noise at the time the frequency-domain data of the input signal is directly acted upon for modifying the frequency-domain characteristics.

It is another object of the present invention to provide a recording medium having recorded thereon encoded data obtained by the above method and device.

According to the present invention, there is provided a method for compressing digital signals including the steps of dividing an input signal into at least two bands, obtaining frequency-domain data of at least two bands of the input signal, and acting on at least one characteristic of the frequency-domain data. The step of acting on at least one characteristic acts on frequency-domain characteristics for maintaining the condition of canceling the aliasing noise by the frequency division and subsequent frequency synthesis performed by a synthesis filter in association with the division at the time of information expansion.

With the method and device for compressing digital signals according to the present invention, the condition of canceling the aliasing noise and the frequency-domain characteristics is changed when acting on the frequency-domain characteristics for achieving pre-set characteristics. In the high frequency range, priority is placed on operation on the frequency-domain characteristics rather than on the condition of cancellation of the aliasing noise in the high frequency range.

The recording medium according to the present invention has recorded thereon compressed data obtained by the above method and device.

The compressed data may also be transmitted.

With the digital signal compressing method and device according to the present ingention, the frequency-domain characteristics of the input signal are acted upon for maintaining the condition of canceling the aliasing noise as required at the time of constituting the band-dividing filter and band-synthesis filter.

On the other hand, the frequency-domain characteristics of the input signals are acted upon with such characteristics as to afford symmetry with respect to the cut-off frequency of the band-splitting filter and the band-synthesizing filter, for maintaining the condition of cancellation of the aliasing noise.

The degree of preference between the operation on the frequency-domain characteristics of the input signal and the condition of cancellation of the aliasing noise may be variable depending upon the input signal and/or the example of application.

For music signals in general, it is practical to put priority on the operation on the frequency-domain characteristics rather than on cancellation of the aliasing noise.

With the method and apparatus for compressing digital signals according to the present invention, in particular, with such method and device in which a band-splitting filter is used for information compression for dividing the input signal into discrete frequency bands and a band-synthesizing filter is used for information expansion, the frequency-domain characteristics can be acted upon without obstructing the condition of cancellation of the aliasing noise at the time of directly acting on the frequency-domain data of the input signal. Thus the frequency-domain characteristics of the input signal can be acted on easily without requiring a new mechanism or device other than the information compressing mechanism or device.

With the recording medium of the present invention, having recorded thereon compressed data obtained by the above method and device, the recording capacity of the recording medium may be exploited more effectively than with a conventional recording medium. In addition, when transmitting the data compressed by the digital signal compressing method and device, the network utilization efficiency may be higher than with the conventional system.

BRIEF DESCRIPTION OF THE DRAWINGS

FIGS. 8A, 8B, 8C, 8D, 8E, 8F, 8G and 8H illustrate the manner of generation and cancellation of the aliasing noise in a QMF filter.

FIGS. 9A, 9B, 9C, 9D, 9E, 9F and 9G illustrate changes in the aliasing noise when characteristics on the frequency axis are changed after band-splitting by a filter.

DESCRIPTION OF THE PREFERRED EMBODIMENT

Figure 1:
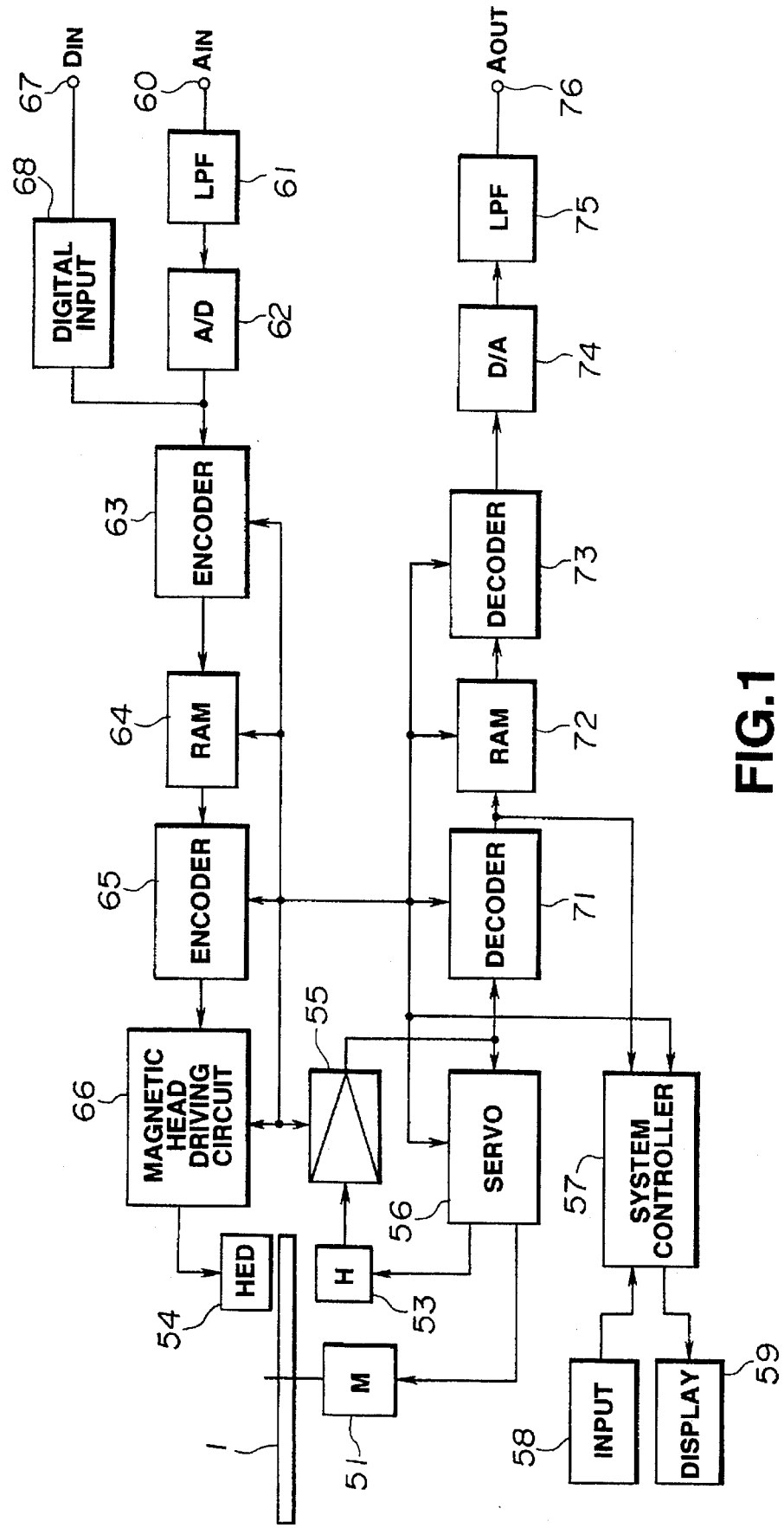
FIG. 1 is a block circuit diagram showing an illustrative construction of a recording/reproducing apparatus for encoded data as a digital signal compressing apparatus for carrying out the digital signal compressing method embodying the present invention (disc recording/reproducing apparatus).

Referring to the drawings, an illustrative embodiment of the present invention will be explained in detail.

FIG. 1 schematically shows an embodiment in which the present invention is applied as a digital signal compressing apparatus to a compressed data recording/reproducing apparatus.

Referring to FIG. 1, a magneto-optical disc 1 run in rotation by a spindle motor 51 is employed as a recording medium. For recording data on the magneto-optical disc 1, a magnetic field modulated in accordance with recording data is impressed by a magnetic head 54 on the disc as a laser light is radiated on the disc by an optical head 53 for recording data along the recording track of the magneto-optical disc 1 by way of so-called magnetic field modulation recording. During reproduction, the recording track of the magneto-optical disc 1 is traced with the laser light by the optical head 53 by way of performing photo-magnetic reproduction of the recorded data.

The optical head 53 is made up of a laser light source, such as a laser diode, optical components, such as collimator lens, objective lens, polarization beam splitter and a cylindrical lens, and a photodetector having a light receiving section of a pre-set pattern. The optical head 53 is mounted facing the magnetic head 54 with the magneto-optical disc 1 in-between. For recording data on the magneto-optical disc 1, the magnetic head 54 is driven by a driving circuit 88 of a recording system as later explained for impressing the modulating magnetic field corresponding to the recording data while radiating the laser light on a target track of the magneto-optical disc 1 for effecting thermo-magnetic recording in accordance with the magnetic field modulation system. The optical head 53 detects the reflected light of the laser light radiated on the target track for detecting the focusing error and the tracking error by e.g. the astigmatic method and the push-pull method, respectively. For reproducing data from the magneto-optical disc 1, the optical head 53 detects the tracking error and the focusing error at the same time as it detects the difference of the angle of polarization from the target track of the laser light for generating the playback signal.

An output of the optical head 53 is fed to an RF circuit 55 which then extracts the focusing error signal and the tracking servo signal from the output of the optical head 53 to route the signals to a servo control circuit 56 while converting the playback signal into a bi-level signal which is fed to a decoder 71 of the reproducing system 71.

The servo control circuit 56 is made up of a focusing servo circuit, a tracking servo control circuit, a spindle servo control circuit and a thread servo control circuit. The focusing servo control circuit focusing-controls the optical system of the optical head 53 for reducing the focusing error signal to zero. The tracking servo control circuit tracking-controls the optical system of the optical head 53 for reducing the tracking error signal to zero. The spindle motor servo control circuit controls the spindle motor 51 for running the magneto-optical disc 1 in rotation at a pre-set rotational velocity, such as at constant linear velocity. The thread servo control circuit shifts the optical head 53 and the magnetic head 54 to a target track position of the magneto-optical disc 1 designated by a system controller 57. The servo control circuit 56, effecting these various control operations, transmits the information specifying the operating states of various components controlled by the servo control circuit 56.

A key inputting unit 58 and a display unit 59 are connected to the system controller 57. The system controller 57 controls the recording system and the reproducing system with the recording mode designated by the operating input information by the key inputting unit 58. The system controller 57 controls the recording position or the reproducing position on the recording track traced by the optical head 53 and the magnetic head 54 based upon the sector-based address information reproduced by sub-code Q-data or the header time from the recording track of the magneto-optical disc 1. The system controller 57 also manages control for displaying the playback time based upon the data compression ratio and the playback position information on the recording track.

For displaying the playback time, the sector-based address information (absolute time information) reproduced by the sub-code Q-data and the header time from the recording track of the magneto-optical disc 1 is multiplied with a reciprocal of the data compression ratio, that is 4 if the compression ratio of ¼ During recording, it is also possible to display the current position in terms of the actual recording time by reading out the absolute time information pre-recorded or pre-formatted on the recording track of the magneto-optical disc and by multiplying the read-out pre-formatted absolute time information with the reciprocal of the data compression ratio.

Then, in the recording system of the data recording/reproducing apparatus, an analog audio input signal AIN from an input terminal 60 is fed via a low-pass filter 61 to an A/D converter 62 which then quantizes the analog audio input signal AIN. A digital audio signal obtained from the A/D converter 62 is fed to a PCM encoder 63. A digital audio input signal DIN from an input terminal 67 is fed via an input interfacing circuit 68 to an ATC encoder 63. The ATC encoder 63 performs bit-compression on the digital audio PCM data of a pre-set transfer rate quantized from the input signal AIN by the A/D converter 62 by way of performing bit compression (data compression). Although the compression ratio is four in the illustrated embodiment, this compression ratio is not limitative and may be set to any desired value depending on the particular application.

The memory 64 is used as a buffer memory for transiently storing ATC data supplied from the AC encoder 63 and recording the stored data on the disc when the necessity arises.

The memory 72 is controlled as to data writing and data readout by the system controller 57 so that playback data supplied from the decoder 71 to the memory 72 at a transfer rate of 75 sectors per second is written in a burst fashion at a transfer rate of 75 sectors per second. The playback data written in a burst fashion in the memory 72 is continuously read out at a transfer rate of 18.75 sectors per second which is one-fourth the normal transfer rate of 75 sectors per second.

The system controller 57 controls the memory 72 so that playback data will be written at a transfer rate of 75 sectors per second and so that the playback data will be continuously read out at a transfer rate of 18.75 sectors per second. The system controller 57, controlling the memory 72 as described above, controls the playback position so that the playback data written in a burst fashion from the memory 72 by this memory control will be continuously reproduced from the recording track of the magneto-optical disc 1. The playback position is controlled in such a manner that the system controller 57 controls the playback position of the playback data read out in a burst fashion from the memory 72 from the system controller 57 and a control signal specifying the playback position on the recording track of the magneto-optical disc 1 or the optical disc is sent to the servo control circuit 58.

The ATC audio data continuously read out from the memory 72 at a transfer rate of 18.75 sectors per second are fed to the ATC decoder 73. The ATC decoder 73 expands the ATC data by a factor of four by way of bit expansion for reproducing 16-bit digital audio data. The digital audio data from the ATC decoder 73 is fed to a D/A converter 74.

The D/A converter 74 converts digital audio data supplied from the ATC decoder 73 into analog signals for forming an analog audio output signal AOUT. The analog audio signal AOUT from the D/A converter 74 is issued via a low-pass filter 75 at an output terminal 76.

The method and apparatus for high efficiency encoding and decoding of the ATC encoder 63 and the ATC decoder in FIG. 1 according to the present invention will be explained in detail. That is, referring to FIGS. 2 et seq., the technique of high efficiency encoding input digital signals, such as audio PCM signals, using the techniques of sub-band coding (SBC), adaptive transform coding (ATC) and adaptive bit allocation, will be explained in detail.

Figure 2:
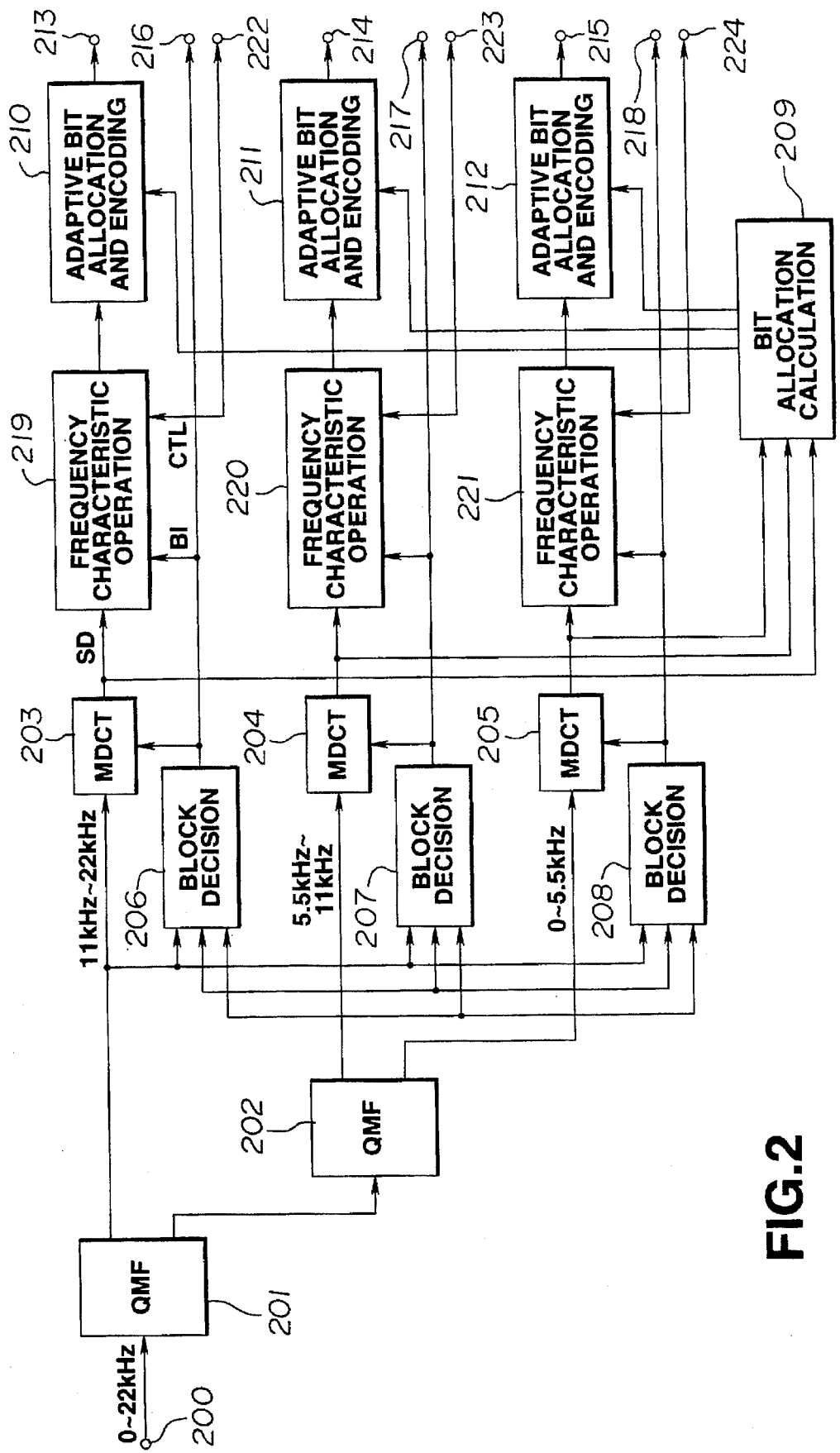
FIG. 2 is a block circuit diagram showing an illustrative example of a high efficiency encoder that may be employed for bit rate compression encoding in the embodiment of FIG. 1.
Figure 3A:
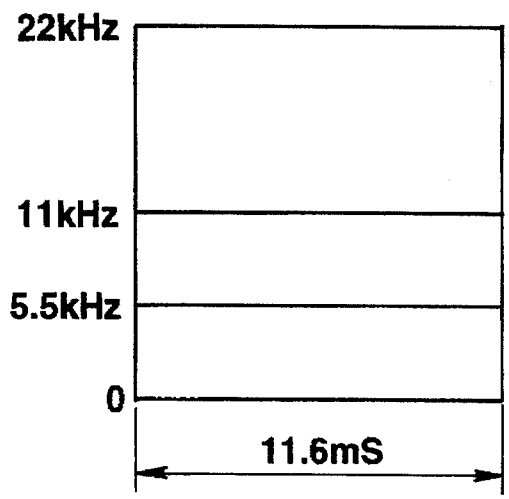
FIGS. 3A, 3B, 3C and 3D illustrate the construction of the orthogonal transform block used for bit compression.
Figure 3B:
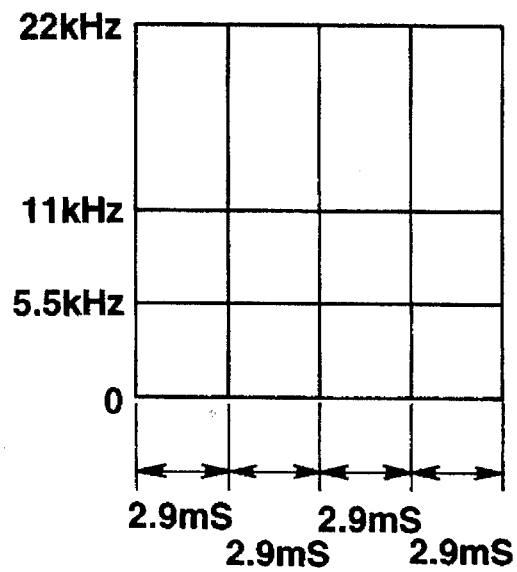
Figure 3C:
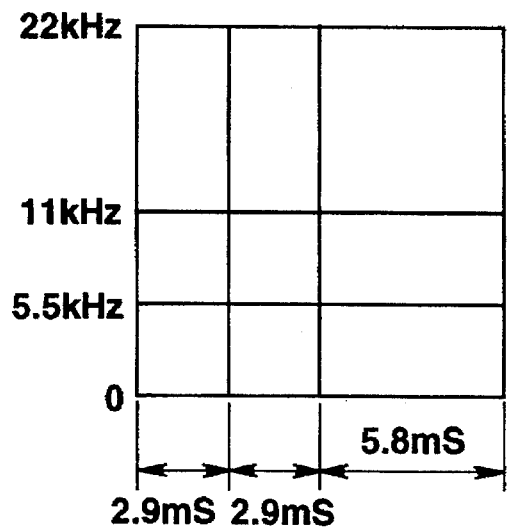
Figure 3D:
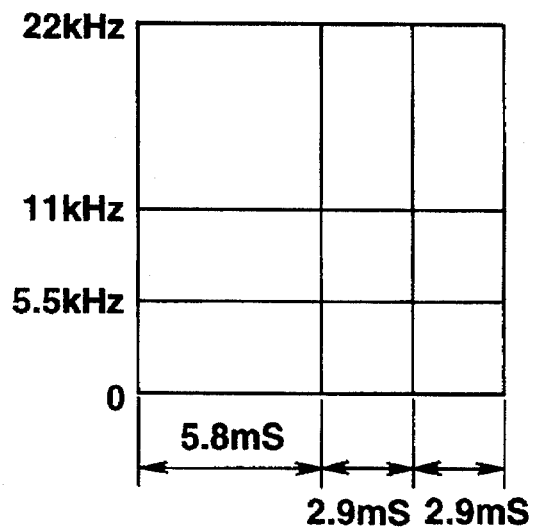

FIG. 2 shows an illustrative construction of a high efficiency coding device for data compression enclosed within the recording/reproducing apparatus of the illustrated embodiment. With the high efficiency encoder, the input digital signals are divided into at least two frequency bands so that the lower most two neighboring bands will be equal in bandwidths and so that the bandwidth will be broader with increase in frequency. The digital signals for each frequency band are formed into blocks and orthogonally transformed on the block basis. The resulting frequency-domain spectral data are encoded with adaptive bit allocation for each of critical bands for lower frequency ranges and for each sub-band sub-divided from the critical bands for the mid to high frequency ranges for taking the floating efficiency into account. These blocks are usually the blocks subjected to generation of quantization noise. The critical bands mean the frequency bands divided from the audible frequency range in order to take into account psychoacoustic characteristics of the human hearing mechanism. Thus, each critical band is the band of a narrow-band noise masking a pure tone having a frequency in the vicinity of the frequency of the noise and the same intensity as the noise. The critical bands become broader in the direction of the increasing frequencies. The audible frequency range of from 1 to 22 kHz is divided into, for example, 25 critical bands.

More specifically, audio PCM signals having a frequency range of 0 to 22 kHz, with the sampling frequency of 44.1 kHz, are supplied to an input terminal 200 (FIG. 2). These input digital signals are divided by a frequency dividing filter 11, such as, for example, a QMF filter, into signals having a frequency range of 0 to 11 kHz and a frequency range of 11 to 22 kHz. The signals having the frequency range of 0 to 11 kHz are similarly divided by a similar frequency dividing filter 202, such as a QMF filter, into signals having a frequency band of 0 to 5.5 kHz and signals having a frequency band of 5.5 kHz to 11 kHz. The signals having the frequency range of 11 to 22 kHz from the frequency dividing filter 201 are transmitted to a modified DCT (MDCT) circuit 203, while the signals having the frequency range of 5.5 to 11 kHz from the frequency dividing filter 202 are transmitted to an MDCT circuit 204 and the signals having the frequency range of 0 to 5.5 kHz from the frequency dividing filter 202 are transmitted to an MDCT circuit 205.

One of the techniques of dividing the input digital signals into at least two frequency bands is by using the QMF filter. In 1976 R. E. Crochiere Digital Coding of Speech in Sub-band, Bell Syst. Tech. J. Vol.55, No.8 1976, there is elucidated a technique of division of the frequency spectrum by a filter, such as QMF.

In ICASSP 83, Boston, "Polyphase Quadrature Filters—A New subband coding technique" by Joseph H. Rothweiler, there is described a technique of dividing the frequency spectrum into equal frequency band widths. This polyphase quadrature filter has a feature that the signals can be divided into at least two bands of equal widths at a time.

As an example of the above-described orthogonal transform, there is such orthogonal transform in which input audio signals are divided into time blocks of pre-set length (frames) and processed with fast Fourier transform (FFT), cosine transform (DCT) or modified DCT (MDCT) for transformation of time-domain signals into frequency-domain signals. Discussions on MDCT may be found in ICASSP 1987 Sub-band/Transform Coding Using Filter Bank Designs Based on Time Domain Aliasing Cancellation J. P. Princen, A. B. Bradley Univ. of Surrey, Royal Melbourne Inst. of Tech.

Specific examples of the blocks of the respective bands supplied to each of the MDCT circuits 203 to 205 for standard input signals are shown in FIG. 3. In the examples shown in FIG. 3, each of three filter output signals independently has at least two orthogonal transform block sizes for each band. The time resolution may be switched depending upon temporal characteristics and the frequency distribution of the signals. If the signal is temporally quasi-stationary, the orthogonal transform block size is set to a longer value of 11.6 msec as shown in the long mode of FIG. 3A. If the signal is non-stationary, the orthogonal transform block size is divided into two. With the short mode shown in FIG. 3B, the respective bands are divided into four blocks each of 2.9 msec. With the middle mode A shown in FIG. 3C and with the middle mode B shown in FIG. 3D, each band is divided in part into two portions each of 5.8 msec and in part into four portions each of 2.9 msec. This allows to cope with actual complex input signals. It is apparent that the orthogonal transform block size can be divided in a more complex manner insofar as the scale of the processing apparatus permits. The block sizes or the processing block lengths are determined by block size decision circuits 206 to 208 shown in FIG. 2 and transmitted to the MDCT circuits 203 to 205 while being issued as the block size information of the respective blocks at output terminals 216 to 218.

Figure 4:
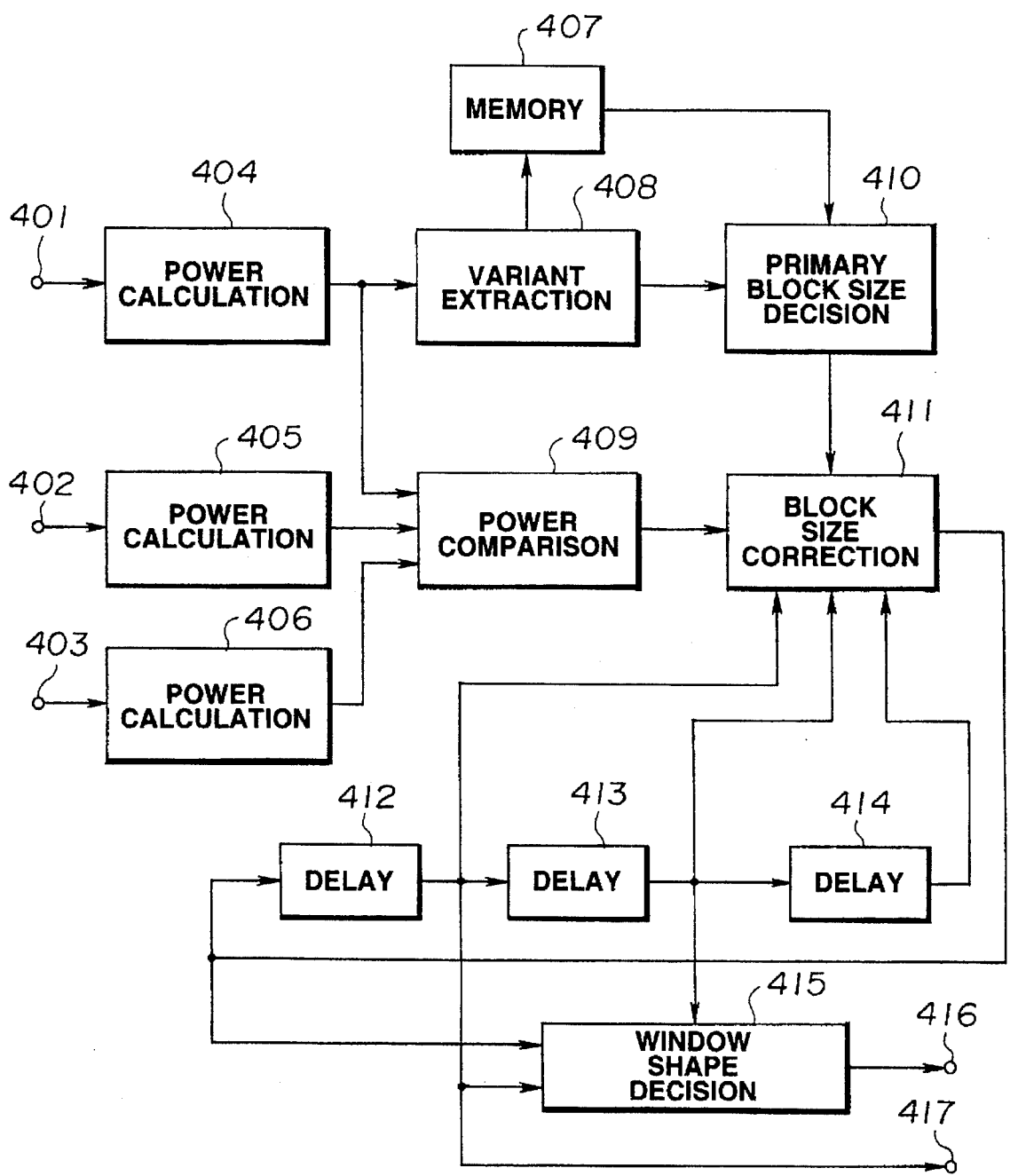
FIG. 4 is a block circuit diagram showing an illustrative construction of a circuit for determining the block size for orthogonal transform.

FIG. 4 shows, in a block circuit diagram, a schematic arrangement of an illustrative example of a block size decision circuit. The block size decision circuit 206 shown in FIG. 2 is taken as an example for explanation. Of the outputs of the band-splitting filter 201 of FIG. 2, the output in the frequency range of 11 to 22 kHz is routed via an input terminal 401 of FIG. 4 to a power calculating circuit 404. Of the outputs of the band-splitting filter 202 of FIG. 2, the output of 5.5 kHz to 11 kHz is routed via an input terminal 402 of FIG. 4 to a power calculating circuit 405, while the output of 0 to 5.5 kHz is routed via an input terminal 403 of FIG. 4 to a power calculating circuit 408. The block size decision circuits 207, 208 in FIG. 2 are the same in operation as the block size decision circuit 208 except that input signals to input terminals 401 to 403 differ from those for the block size decision circuit 206. The input terminals of the block size decision circuits 208 to 208 are in a matrix configuration, such that the output in the range of from 5.5 kHz to 11 kHz of the band-splitting filter 202 of FIG. 2 is connected to the input terminal 401 of the block decision circuit 207, While the output of 0 to 5.5 kHz is connected to the input terminal 402. The same holds for the block size decision circuit 208.

Referring to FIG. 4, each of the power calculating circuits 404 to 406 finds the power of the power of each frequency range by integrating the input time waveform over a pre-set time. The integrating time width needs to be shorter than the minimum time block size among the above-mentioned orthogonal transform block sizes. In place of the above calculating method, the absolute value of the maximum amplitude or the mean power of the amplitude within the minimum time width of the orthogonal transform block size may also be employed as the representative power for achieving the same effect. An output of the power calculating circuit 404 is routed to a variation extraction circuit 408 and to a power calculating circuit 409. The variation calculating circuit 408 finds differential coefficients of the power supplied from the power calculating circuit 404 and routes the differential coefficients as the power variation information to the primary block size decision circuit 410 and a memory 407 as the power variation information.

The memory 407 stores the power variation information from the variation extraction circuit 408 for a time longer than the maximum time length of the orthogonal transform block size. The reason for performing this is that, since temporally neighboring orthogonal transform blocks affect one another by the windowing for orthogonal transform, the primary block size decision circuit 410 is in need of the power change information of a temporally directly previous block. The primary block size decision circuit 410 decides, based upon the power change information of a block under consideration, supplied from the variation extraction circuit 408 and the power change information of the temporally neighboring previous block, supplied from the memory 407, the orthogonal transform block size in the associated frequency band from the temporal shift of the power in the associated frequency band. If a shift more than a pre-set value is noticed, a temporally shorter orthogonal transform block size is selected. The shift point (boundary value) may be fixed for achieving desired results. The block size may be proportional to the frequency for utmost results. That is, it is more effective if the temporally shorter block size is employed for a larger shift for a higher frequency arid the temporally longer block size is employed for a smaller shift for a lower frequency. Although it is desirable that the boundary value be changed smoothly, the value may also be changed in plural steps. The block size thus determined is routed to a block size correction circuit 411.

On the other hand, the power comparator circuit 409 compares power information data of the respective frequency bands transmitted from the power calculation circuits 404 to 408 both concurrently and with time widths corresponding to display of the masking effect on the time axis, in order to find the effect on an output frequency band of the power calculating circuit 404 of other frequency bands, and transmits the result to the block size correction circuit 411. The block size correction circuit 411 corrects the block size transmitted from the primary block size decision circuit 410, based upon the past block size information data sent from respective taps of delays 412 to 414 and the masking information sent from the power comparator circuit 409, so that a temporally longer block size will be selected, and outputs the selected block size to the delay 412 and to a window shape decision circuit 415. The operation executed by the block size correction circuit 415 exploits the fact that, if pre-echo is produced in a frequency band under consideration, but there exists a signal having a larger amplitude in other frequency bands, in particular in a frequency band lower than the frequency band under consideration, the pre-echo raises no problem or is not objectionable insofar as the acoustic sense of the human being is concerned. The masking refers to a phenomenon in which a signal is masked by an other signal due to psychoacoustic characteristics of the human hearing sense and becomes inaudible. The masking effect is classified into the time-axis masking effect, incurred by time-domain audio signals, and the concurrent masking effect, incurred by frequency-domain audio signals. By such masking effect, any noise in a masked range, if any, becomes inaudible. Thus, in actual audio signals, any noise in the masked range is considered to be an allowable noise.

The delay units 412 to 414 sequentially store past orthogonal block sizes and output the stored block sizes to the block size decision circuit 411 at respective taps, that is at respective outputs. An output of the delay unit 412 is connected to an output terminal 417, while outputs of the delay units 412, 413 are connected to the window size decision circuit 415. The outputs of the delay units 412 to 414 perform the role of causing changes in the block size over longer time widths to be utilized by the correction circuit 411 in deciding the block size of the block under consideration. That is, the outputs of the delay units permit the correction circuit 411 to give judgment of preferentially selecting a temporally shorter block size or a temporally longer block size if block sizes of temporally shorter block sizes are selected or not selected in the past, respectively. The number of the delay taps may be increased or decreased depending upon the practical construction and the scale of the apparatus, if need be, except those of the delays 412 and 413 required by the window decision circuit 415 and the output terminal 417.

The window shape decision circuit 415 decides, from the output of the block size correction circuit 411, that is the block size of the block temporally directly following the block under consideration, an output of the delay unit 412, that is the block size of the block under consideration and an output of the delay unit 413, that is the block size of a block temporally directly preceding the block under consideration, the shape of a window used in each of the respective MDCT circuits 203 to 205 shown in FIG. 2, and outputs the window shape at an output terminal 418. An output of the output terminal 417 of FIG. 4, that is the block size information, and an output of the output terminal 417, that is the window shape information, are coupled to respective components as outputs of the block size decision circuits 206 to 208 of FIG. 2.

Figure 5A:
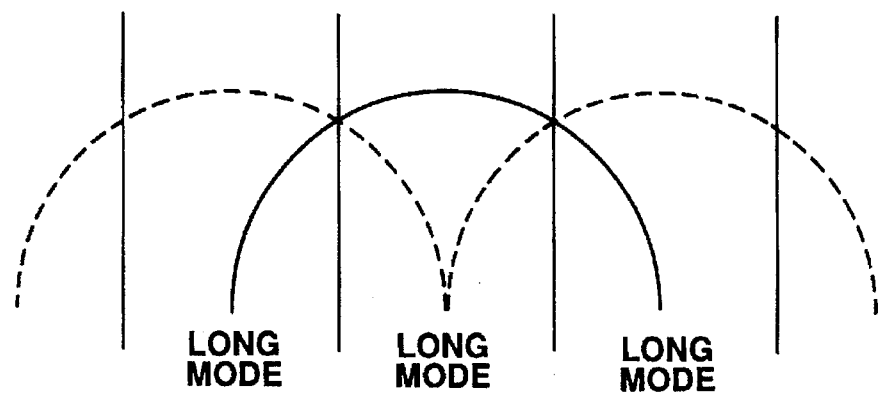
FIGS. 5A, 5B, and 5C illustrate the relation between changes in temporal length of temporally neighboring orthogonal transform blocks and the window shape employed for orthogonal transform.
Figure 5B:
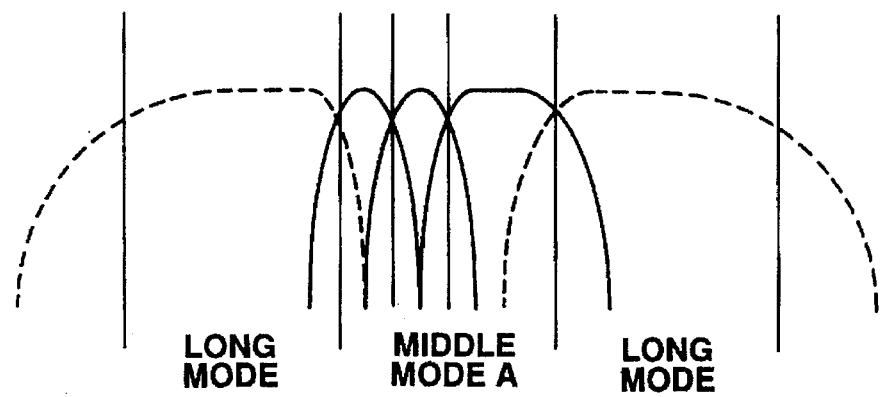
Figure 5C:
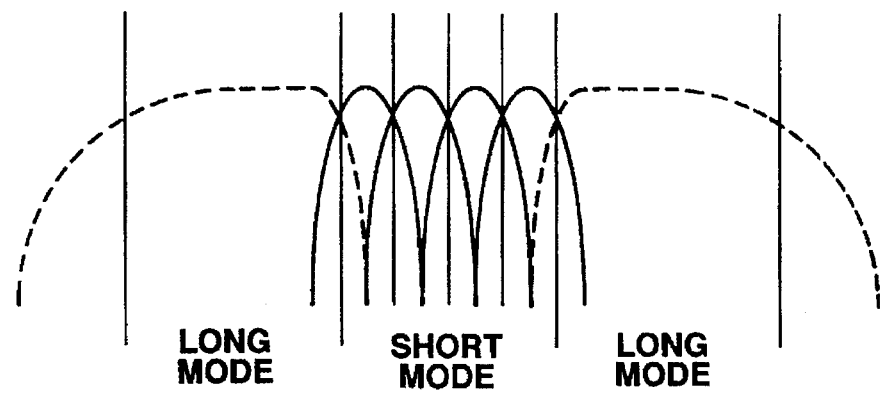

The window shape, determined by the window shape decision circuit 415, is hereinafter explained. As may be seen from FIGS. 5A to 5C showing the shape of neighboring blocks and windows, the windows of neighboring blocks, employed for orthogonal transform, have overlapping portions, as indicated by broken and solid lines. In the illustrated embodiment, the overlap extends as far as the center of the neighboring blocks, such that the window shape is changed with the orthogonal transform sizes of the neighboring blocks.

Figure 6:
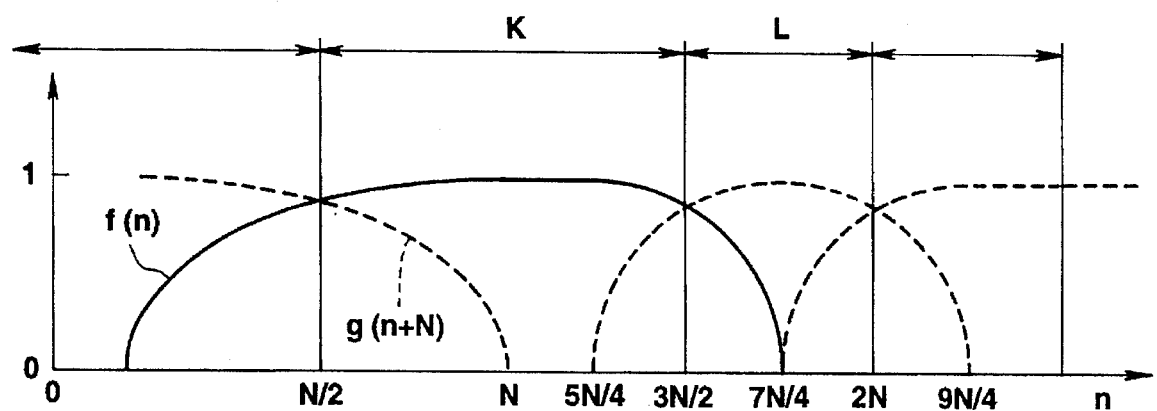
FIG. 6 shows details of the shape of a window employed during orthogonal transform.

FIG. 6 shows details of the window shape. In FIG. 6, the window functions f(n) and g(n+N) are given as functions satisfying the following equations (1):

$$f(n) \times f(L-1-n) = g(n) \times g(L-1-n)$$

$$f(n) \times f(n) + g(n) \times g(n) = 1 \quad (1)$$

where $0 \leq n \leq L-1$.

If the neighboring transform block lengths are equal, L in the equation (1) directly becomes the transform block length. If, however, the neighboring transform block lengths are different, L in the equation (1) is given, for a non-overlapping window area, by the following equation (2):

$$f(n) = g(n) = 1, K \leq n \leq 3K/2 - L/2$$

$$f(n) = g(n) = 0, 3K/2 + L \leq n \leq 2K \quad (2)$$

where L is a shorter transform block size and K is a longer transform block length.

Thus, by setting the window overlapping portions so as to be as long as possible, the frequency resolution of spectral components at the time of orthogonal transform may be improved. It is seen from above that the shape of the window employed for orthogonal transform is determined after definitely setting the orthogonal transform block sizes of temporally consecutive three blocks. Thus, in the illustrated embodiment, a one-block difference is produced between the blocks of input signals entering the input terminals 401 to 403 of FIG. 4 and those of output signals at the output terminals 416, 417.

The block size decision circuits 206 to 208 of FIG. 2 may be constituted if the power calculating circuits 405, 406 and the power comparator circuit 409 of FIG. 4 are omitted. The delay units 412 to 414, block size correction circuit 411 and the window shape decision circuit 415 may also be omitted if, by fixing the block size at a temporally minimum block size that can be assumed by the orthogonal transform block, only one sort of the window shape is available. Such omission leads to a construction with a small delay which is desirable for application wherein delay in processing time is not desired.

Returning to FIG. 2, the frequency-domain spectral data from MDCT processing by the MDCT circuits 203 to 205, that is MDCT coefficient data, are transmitted to frequency characteristic operating circuits 219 to 221 and to a bit allocation calculating circuit 209.

The frequency characteristic operating circuits 219 to 221 operate on frequency characteristics of frequency-domain spectral data transmitted from the MDCT circuits 203 to 205, based upon the block size information transmitted from the block decision circuits 206 to 208 and the frequency characteristic operating information at input/output terminals 222 to 224, as commanded by the system controller 57 of FIG. 1, and transmit the operated data to respective adaptive bit allocation encoding circuits 210 to 212. The operated data are also transmitted from the input/output terminals 222 to 224 to the system controller 57 (FIG. 1) so as to be used for frequency-based power display, that is for so-called spectrum analyzer display.

Figure 7:
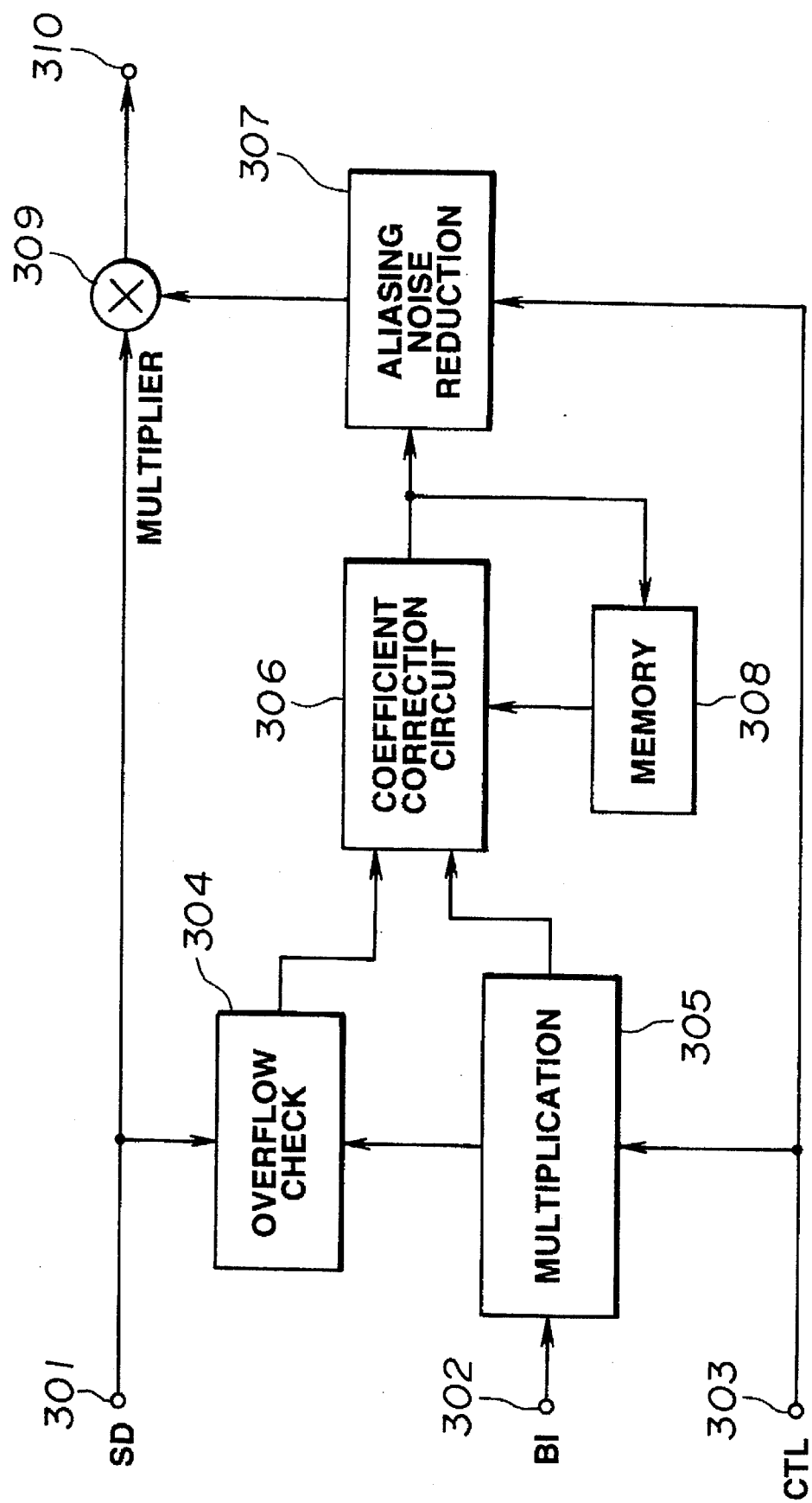
FIG. 7 is a block circuit diagram showing a structural example of a circuit for carrying out an operation on the frequency.

FIG. 7 schematically shows, in a block diagram, an illustrative construction of each of the frequency characteristic operating circuits 219 to 221. In FIG. 7, the frequency characteristic operating circuit 219 only is explained for ease in understanding. It is however apparent that the remaining frequency characteristic operating circuits 220 and 221 are constructed in a similar manner.

Referring to FIG. 7, the frequency-domain spectral data SD from the MDCT circuit 203 of FIG. 2 are supplied to an input terminal 301 and thence supplied to an overflow check circuit 304 and a multiplier 309. On the other hand, the block information BI from the block decision circuit 206 of FIG. 2 is supplied to an input terminal 302, while the frequency characteristic operating information CTL from the input/output terminal 222 of FIG. 2, that is from the system controller 57 of FIG. 1, is supplied to an input terminal 303, and thence supplied to a multiplication coefficient calculating circuit 305.

The multiplication coefficient calculating circuit 305 calculates the power (intensity) in each frequency of the frequency-domain data or MDCT coefficient data, by the block information BI, while allocating the frequency characteristic operating information CTL to each frequency-domain spectral data SD for normalization. The multiplication coefficient calculating circuit 305 also calculates multiplication coefficients and transmits the resulting coefficients to the overflow check circuit 304. By adopting the technique of directly operating on the frequency-domain spectral data or the MDCT coefficient data, pre-set characteristics may be obtained easily simply by multiplication of the normalized coefficients.

The overflow check circuit 304 checks whether or not the result of multiplication exceeds a pre-set upper limit, using the coefficients transmitted from the multiplication coefficient calculating circuit 305 and the frequency-domain spectral data SD transmitted from the input terminal 301. This upper limit, as set by the word length of the input/output signals and the calculation accuracy of the device or circuitry, is set herein to a 64th power of 2. If it is found by this check that overflow has occurred, the overflow check circuit 304 transmits the information to the coefficient correction circuit 306. If overflow has not occurred, no signal is transmitted by the check circuit 304.

In the illustrated embodiment, the following two operations are selectively or conjointly executed by way of processing in case of overflow. If, as a result of multiplication, the number of frequency-domain spectral data SD where overflow occurs is small, only the coefficient of data where overflow has occurred is corrected, so that the result of multiplication is not more than the upper limit of data. This operation is similar to the amplitude limiting operation in time-domain data. If the number of frequency-domain spectral data SD where overflow occurs is larger, the multiplication coefficients in their entirety are normalized so that data which gives the maximum result of multiplication will not exceed the above-mentioned upper limit. This operation is similar to the amplitude compacting operation in time-domain data.

The above-mentioned correction of the multiplication coefficients for prohibiting overflow from occurring can be changed depending upon the characteristics of input signals and compression technique for utmost results. In the illustrated embodiment, satisfactory results could be obtained by carrying out the correction of the previous results of multiplication by affording weighting corresponding to the frequency of peak components of the input signals.

If the block under consideration is the processing block where overflow occurs, the coefficient correction circuit 306 immediately corrects the coefficient. If processing for overflow was carried out for the temporally previous processing block, while there is no necessity of carrying out the processing for overflow in the processing block under consideration, coefficient correction is executed with moderate changes over at least two blocks taking into account the state of coefficient correction of the temporally previous block outputted by the memory 308. Such control is desirably changed depending upon the particular application and input signal characteristics for utmost results. The multiplication coefficients thus corrected are transmitted to an aliasing noise reduction circuit 307.

The aliasing noise reduction circuit 307 operates on the frequency characteristics by the frequency characteristic operating circuits 219 to 221 in FIG. 2 for modifying the coefficients for reducing the aliasing noise which ceases to be canceled. In the illustrated embodiment, this aliasing is generated on the occasion of frequency division by the QMF filters 201 and 202 and decimation and canceled on the occasion of frequency band synthesis by the band-synthesizing filters 101, 102 as described later in connection with FIG. 6, usually without raising a problem. However, if frequency-domain characteristics have been changed, the aliasing noise cannot be canceled sufficiently, thus raising a problem.

The aliasing produced by the QMF filter is explained. As explained previously, if a signal is divided by a filter into two bands of an equal width and subsequently decimated to a one-half rate, by way of sampling, aliasing is produced in both bands due to unavoidable filter defects. However, if a quadrature mirror filter (QMF) is used, both aliasing components can be canceled when the two signals are synthesized for restoring the signal of the original band.

The conditions under which the aliasing components are canceled in the QMF filter are first explained. For the QMF filter, a symmetrical FIR filter having an even number of orders is employed. If the impulse response of the low-pass filter F1 for limiting the band to one-half is f1, and the z-transform thereof is F1(z), then F1(z) can be represented by the equation (3):

$$F_1(z) = \sum_{n=0}^{L-1} F_1(n)z^{-n} \tag{3}$$

From the low-pass filter of the equation (3), a high-pass filter F2 having an impulse response shown by the equation (4):

$$f_2(n) = (-1)^n f_1(n) \tag{4}$$

may be constituted.

If the filters F1, F2 are caused to operate on an input signal string $\underline{x}$, x1 and x2 shown by the equation (5):

$$x_1(n) = \sum_{n=0}^{L-1} f_1(k)x(n-k) \tag{5}$$

$$x_2(n) = \sum_{n=0}^{L-1} f_2(k)x(n-k)$$

may be obtained.

Further, x1 and x2 are decimated to one-half rates to produce y1 and y2, that is signal strings divided into two equal-width bands, as shown by the equation (6):

$$y_1(m) = x_1(2m)$$

$$y_2(m) = x_2(2m) \tag{6}$$

Since the high-band side signal y2 is aliased towards the low-band side at the time point of decimation, the maximum frequency component of x2 is observed after decimation as y2 as the minimum frequency signal. In the illustrated embodiment, two stages of the above-described QMF filters are used for dividing the signal and the resulting two-band signal is orthogonally transformed for information compression. In the illustrated embodiment, y1 and y2, shown by the equation (6), are directly synthesized for producing the pre-division signal string. The signal strings y1 and y2, containing the aliasing noise component, are synthesized in the following manner. First, zeros are interpolated in y1 and y2 for producing signal strings u1 and u2 shown by the equation (7):

$$u_1(n) = \begin{cases} y_1(n/2) & \text{if } n: \text{even} \\ 0 & \text{otherwise} \end{cases} \tag{7}$$

$$u_2(n) = \begin{cases} y_2(n/2) & \text{if } n: \text{even} \\ 0 & \text{otherwise} \end{cases}$$

Next, filters G1 and G2 having impulse response represented by the equation (8):

$$g_1(n) = f_1(n) \quad 0 \leq n \leq L-1 \tag{8}$$

$$g_2(n) = -(-1)^n f_1(n) \quad 0 \leq n \leq L-1$$

are constituted from the filter shown by the equation (3), and are caused to operate on u1 and u2 represented by the equation (7) for producing t1 and t2 represented by the equation (9):

$$t_1(n) = \sum_{k=0}^{L-1} g_1(k)u_1(n-k) \tag{9}$$

$$t_2(n) = \sum_{k=0}^{L-1} g_2(k)u_2(n-k)$$

If $\underline{s}$ is represented by the equation (10):

$$s(n) = t_1(n) + t_2(n) \tag{10}$$

the relation shown by the equation (11):

$$S(z) = \frac{1}{2}(F_1^2(z) - F_1^2(-z))X(Z) \tag{11}$$

holds between z-transform X of $\underline{x}$ and z-transform S of $\underline{s}$.

Since F1 is a symmetrical FIR filter, and hence has linear phase characteristics, it may be represented by the equation (12):

$$F_1(e^{jwT}) = F_1(w)e^{j(L-1)\pi \frac{w}{w_s}} \tag{12}$$

By utilizing this, the following equation (13):

$$S(e^{jwT}) = \frac{1}{2}\left(\left(F_1^2(w) + F_1^2\left(w + \frac{W_s}{2}\right)\right)e^{-j(L-1)wT}\right)X(e^{jwT}) \tag{13}$$

holds for an even l.

If the impulse response of the low-pass filter F1 is set so that the equation (14):

$$F_1^2(w) + F_1^2\left(w + \frac{W_s}{2}\right) = 1 \tag{14}$$

holds, $\underline{s}$ corresponds to a signal string having an amplitude one-half of the signal string $\underline{x}$ and delayed from the signal string $\underline{x}$ by L−1 samples.

This means that the aliasing noise component contained in y1 and y2 represented by the equation (6) have been eliminated.

Thus it is seen that the conditions for canceling the aliasing noise in the QMF filter reside in the fact that, if the impulse response of the low-pass filter F1 employed is f1(n) and its z-transform is F1(n), the equation (14) holds, and that the impulse responses g1, g2 of the synthesis filters G1 and satisfy the equation (8).

Referring to FIGS. 8A to 8H, the aforementioned aliasing noise is explained. FIG. 8A shows characteristics on the frequency axis when the frequency spectrum is divided into two equal bandwidths using a QMF. The low-pass filter and the high-pass filter have frequency characteristics symmetrical with respect to the cut-off frequency fs/4. In FIG. 8A showing the frequency spectrum, centered about fs/4, a frequency range A represents a range where aliasing noise occurs strongly due to defects in the filter characteristics of the two filters. If a signal denoted by an upwardly directed arrow has entered the filter system, outputs of the respective filters are as shown by upwardly directed arrows in FIGS. 8B and 8E, respectively. The signal which should be present in the pass-band of the high-pass filter also appears in an output of the low-pass filter due to defects in filter characteristics.

FIGS. 8C and 8D show the results of decimation under these conditions. Due to decimation, the sampling frequency becomes fs/2, so that low-range data with the frequency not lower than fs/4 and high-range data with the frequency not higher than fs/4 are aliased as shown in FIGS. 8C and 8F and appear as components with the frequency not higher than fs/4. On the other hand, high-range data with the frequency not less than fs/4 are aliased so that data of apparently the lower most range represent data of actually the upper most range. It should be noted that the frequency band shown in FIG. 8F represents high-frequency components.

The aliasing noise generated by decimation is interpolated for synthesis so that it is represented as the frequency component shown in FIGS. 8D and 8E. If a filter system satisfying the conditions of canceling the aliasing noise as previously explained is employed for synthesis, the aliasing distortion produced in the low range side as shown in FIG. 8H is canceled, so that the signal which is the same as the input shown in FIG. 8A is produced.

The manner of the aliasing noise and the method of canceling the aliasing noise in case of modifying signal characteristics on the frequency axis as explained in the illustrated embodiment is hereinafter explained. FIG. 9A corresponds to FIG. 8C, that is illustrates the result of passing the signal of FIG. 8A as an input through a low-pass filter and decimating the filter output. Similarly, FIG. 8D corresponds to FIG. 8F, that is illustrates the result of passing the signal of FIG. 8A as an input through a high-pass filter and decimating the filter output.

If, after passing the signal through the low-pass filter and decimating the filtered signal, that is if the frequency-domain characteristics of the signal shown in FIG. 9A are acted upon for raising the intensity in the vicinity of fs/4 as shown in FIG. 9B, the aliasing noise generated by decimation is also intensified, as shown in FIG. 9B. If the signal is interpolated as shown in FIG. 9C, the aliasing noise remains intensified.

If, as shown in FIG. 9F, the output shown in FIG. 9C is synthesized with high-range data shown in FIG. 9E, the aliasing noise component which should be canceled remains intensified, so that the aliasing noise is not canceled, as shown in FIG. 9G.

The result is that changes in the frequency-domain characteristics after slitting the frequency using the QMF system of the illustrated embodiment fail to cancel the aliasing noise components.

Figure 10A:
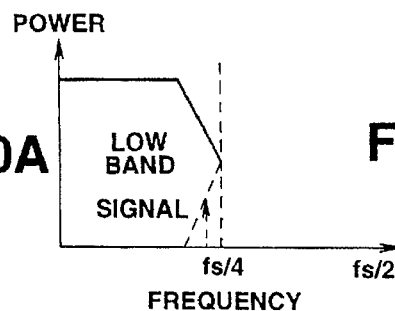
FIGS. 10A, 10B, 10C, 10D, 10E, 10F, 10G and 10H illustrate the changes in the aliasing noise when characteristics on the frequency axis are changed after band-splitting by a filter and the conditions of enabling cancellation of the aliasing noise.
Figure 10D:
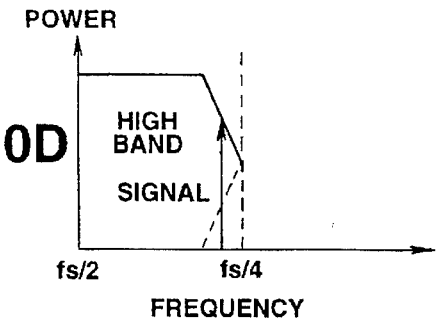

The method of the present invention in which, even if changes in frequency-domain characteristics are effectuated as described above, the aliasing noise may be canceled, is hereinafter explained by referring to FIGS. 10A to 10H. FIG. 10A shows the results of passing the same signal as that of FIGS. 8C or 9A as an input through a low-pass filter and decimating the resulting signal. Similarly, FIG. 10D shows the results of passing the same signal as that of FIGS. 8F or 9D as an input through a high-pass filter and decimating the resulting signal.

Figure 10B:
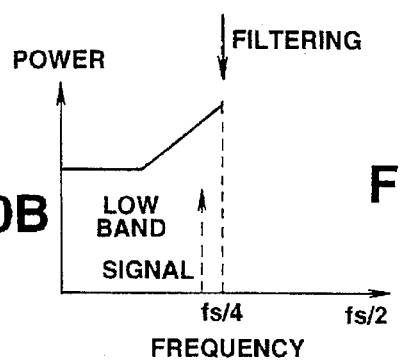
Figure 10E:
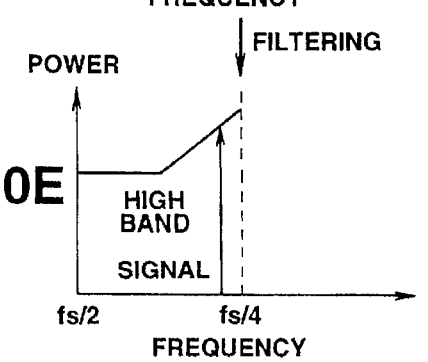
Figure 10C:
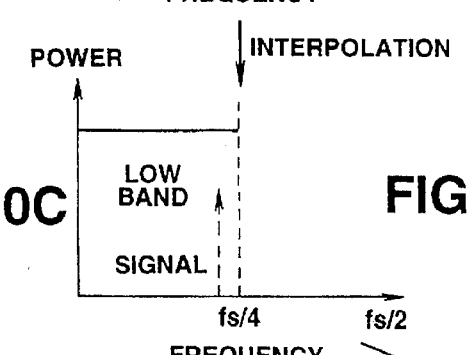
Figure 10F:
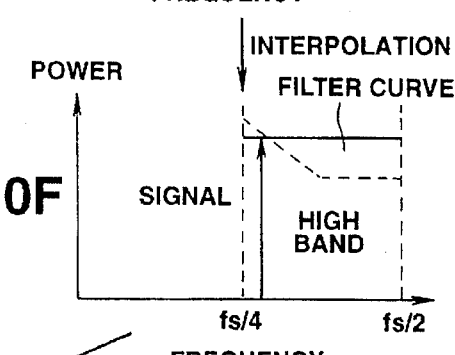
Figure 10G:
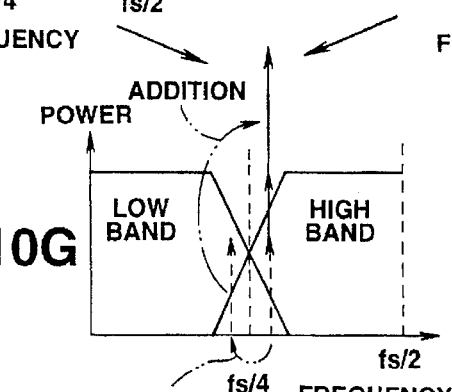
Figure 10H:
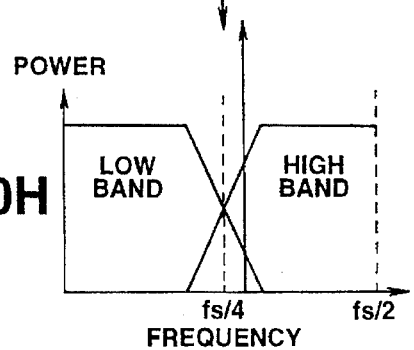

Of FIGS. 10A to 10H, FIGS. 10A, 10B and 10C show the manner on the low-frequency side and correspond to FIGS. 9A, 9B and 9C, respectively. If, as shown in FIG. 10E, the high-range side data is acted upon for changing the frequency-domain characteristics in the same way as shown in FIG. 10B for intensifying signal components and subsequently interpolated, a data string as shown in FIG. 10F is obtained. If, as shown in FIG. 10G, the data shown in FIG. 10F is synthesized with low-range side data shown in FIG. 10C, the aliasing noise can be canceled. In such case, changes in frequency-domain characteristics, shown in FIGS. 10B to 10E, become line-symmetrical between the low-range and high-range sides, with fs/4 as a center, as shown in FIG. 10F. Thus, if changes in frequency characteristics are applied to the frequency-domain data, arrayed in the order of increasing frequency, the aliasing noise can be canceled by selecting characteristics representing line symmetry with respect to fs/4.

Figure 11A:
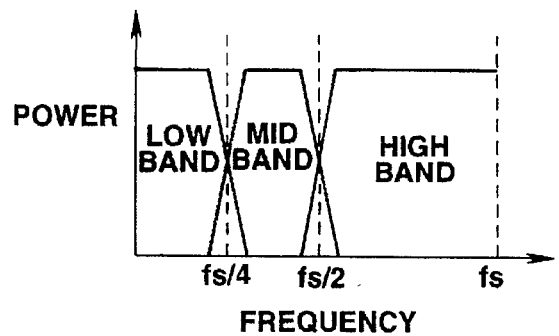
FIGS. 11A, 11B, 11C and 11D illustrate the process of the operation of the aliasing noise reduction circuit in the embodiment shown in FIG. 1.

Referring to FIGS. 11A to 11D, the operation of the aliasing noise reducing circuit 307 is explained. FIG. 11A shows the manner of splitting of the frequency spectrum in the illustrated embodiment. As described previously, the input signal is divided into three bands and subsequently orthogonally transformed using the MDCT circuits 203 to 205 shown in FIG. 2.

Figure 11B:
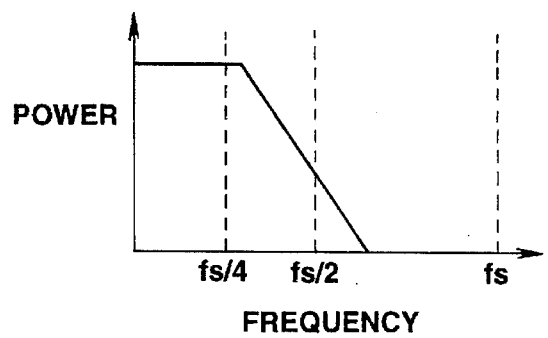
Figure 11C:
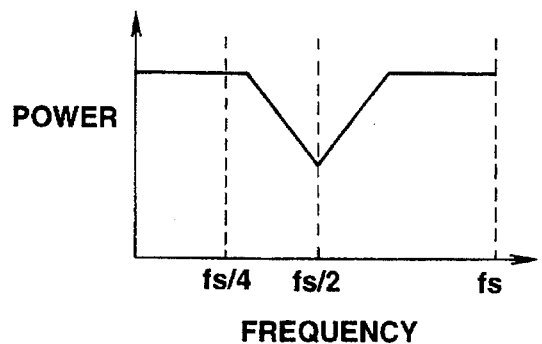

If the low-pass characteristics shown in FIG. 11B are afforded to the frequency characteristic operating circuits 219 to 221 shown in FIG. 2, signal characteristics are drastically changed in the vicinity of the splitting frequency fs/4 such that symmetry between the low frequency side and the high frequency side, centered about fs/4 as an axis of symmetry, becomes collapsed on the frequency axis. The result is that the aliasing noise is not canceled at the time of frequency band synthesis and persists in an output, such that, if the input signal has some energy in the vicinity of fs/4, the produced sound is perceived as being objectionable to the hearer.

By correcting the frequency characteristics so as to exhibit symmetry about fs/4 as the axis of symmetry by the aliasing noise reducing circuit 307 as explained previously in connection with FIG. 11C, the aliasing noise may be canceled, so that the produced sound is not perceived as objectionable to the hearer.

Figure 11D:
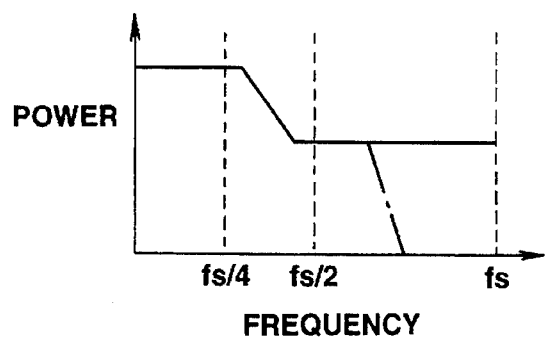

If, depending upon the input signal, some attenuation of the high range side is desired to be maintained, or the aliasing noise caused by the high-range signal tends to be unobjectionable, the high-range attenuation may be kept constant, as shown in FIG. 11D, or attenuation is allowed to be produced after the symmetrical state is kept up to a certain frequency, as shown by a chain-dotted line in FIG. 11D. In the illustrated embodiment, optimum results may be obtained by selecting and/or conjointly applying the above-mentioned correction methods depending upon the high-range energy or power of the input signal or the desired attenuation in the high frequency range.

Returning to FIG. 7, the multiplication coefficients corrected by the aliasing noise reducing circuit 37 as described above are routed to the multiplier 309 so as to be multiplied by frequency-domain spectral data SD for being acted upon with respect to characteristics before being outputted via output terminal 310 to the adaptive bit allocation encoding circuit 210. The respective data, thus acted upon as to frequency characteristics thereof, is routed via input/output terminals 222 to 224 of FIG. 2 to the system controller 57 for being displayed on the display 59 for frequency-based power display or so-called spectrum analyzer display.

The bit allocation calculating circuit 209 calculates, based on the critical bands and spectral data divided to take into account the block floating, the signal energy or peak values for each critical band and each band divided from the critical band in order to take into account the block floating and the masking effect, and routes the numbers of bits to the adaptive bit allocation encoding circuits 210, 211 and 212. The adaptive bit allocation encoding circuits 210, 211 and 212 quantize the spectral data or the MDCT coefficient data depending on the numbers of bits allocated to the respective bands. The data encoded in this manner is outputted at output terminals 213, 214 and 215.

Figure 12:
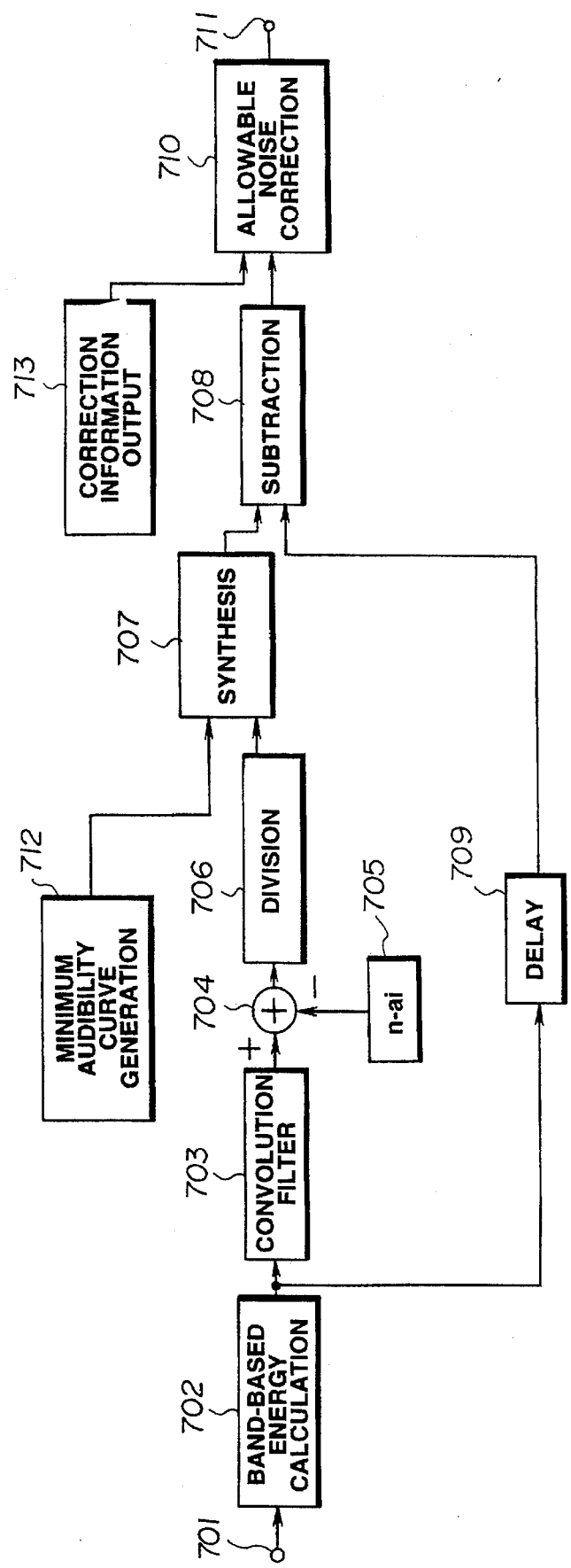
FIG. 12 is a block circuit diagram showing an example of a bit allocation calculating circuit utilizing convolution calculations for realizing bit allocation calculating functions.
Figure 13:
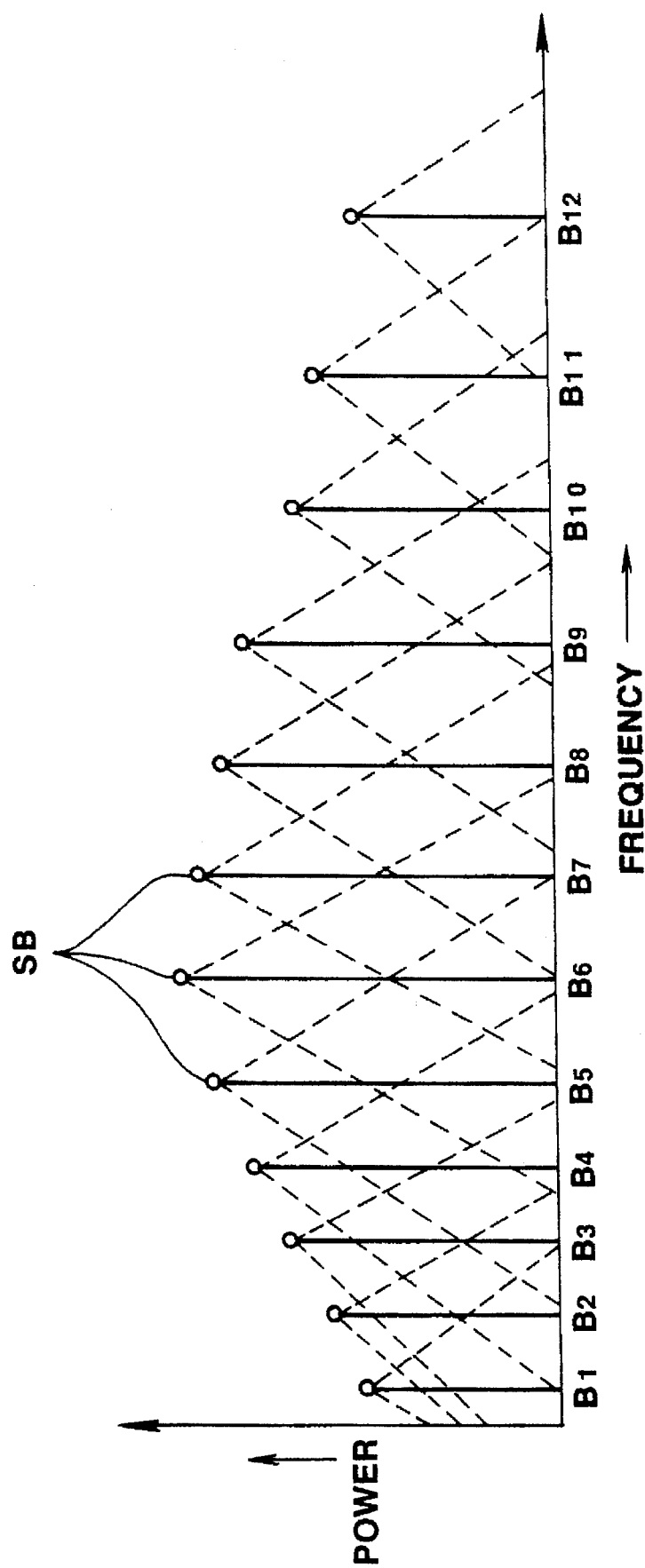
FIG. 13 is a graph illustrating the spectral components of respective bands split for taking account of the critical bands and block floating.

FIG. 12 shows, in a schematic block circuit diagram, an arrangement of an embodiment of the bit allocation calculating circuit 209. Referring to FIG. 12, in which the frequency-domain spectral data from the MDCT circuits 203 to 205 or the MDCT coefficient data are supplied to an input terminal 701, the operation of the bit allocation calculating circuit is explained. The frequency-domain spectral data is transmitted to a band-based energy calculating circuit 702 in which the energies of the critical bands and the bands divided from the critical bands in order to take into account the block floating are found by calculating the sum of the amplitudes of the spectral components in the respective bands. The amplitude peak values or mean values may also be employed in place of signal energy in the respective bands. Each spectral component indicating the sum value of each of the respective bands is indicated as SB in FIG. 7 as an output of the energy calculating circuit 702. In FIG. 7, 12 bands B1 to B12 are shown as indicating the critical bands and the bands sub-divided from the critical bands in order to take into account the block floating, and the amounts of masking, for simplifying the drawing.

Figure 14:
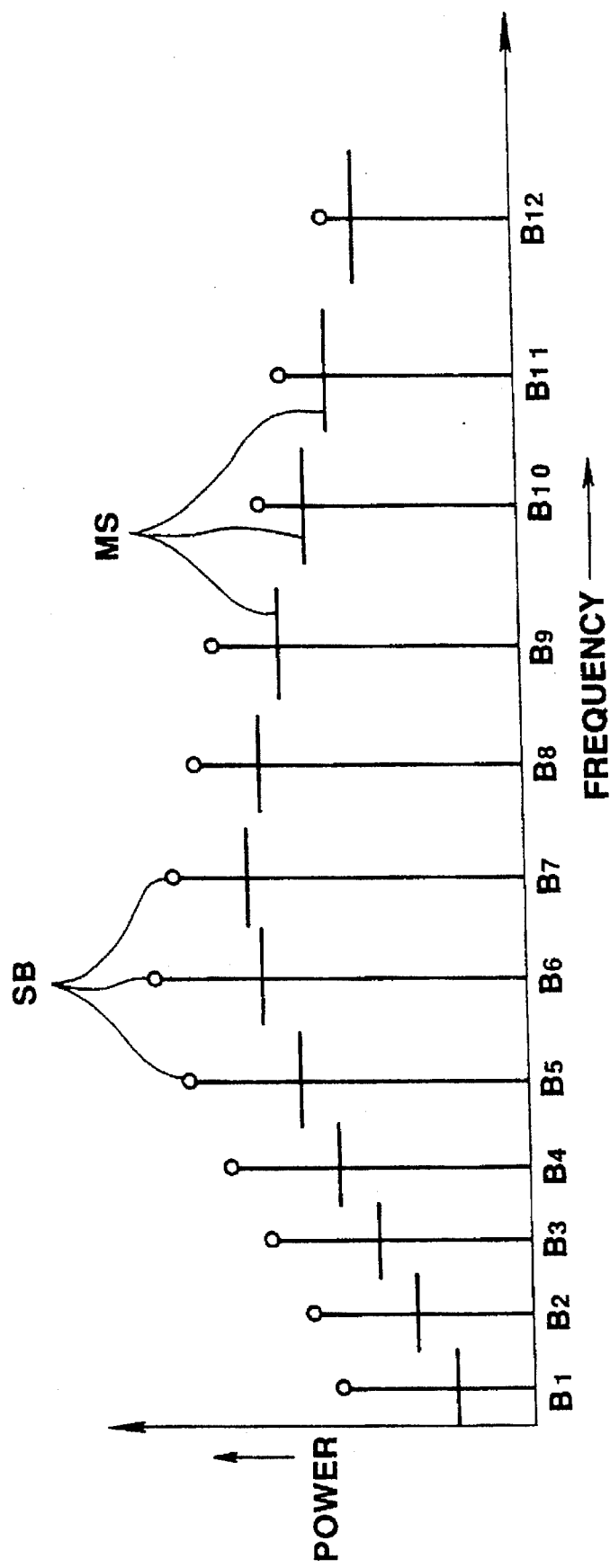
FIG. 14 is a graph illustrating the masking spectrum.

It is noted that an operation of multiplying each spectral component SB by a pre-set weighting function for taking into account the effects of masking is performed by way of convolution. To this end, an output of the band-based energy calculating circuit 702, that is each value of the spectral component SB, is transmitted to a convolution filter circuit 703. The convolution filter circuit 703 is made up of at least two delay elements for sequentially delaying input data, at least two multipliers, such as 25 multipliers associated with the respective bands, for multiplying outputs of the delay elements with filter coefficients or weighting functions, and an adder for finding the sum of the outputs of the respective multipliers. By such convolution, the sum of the portions indicated by broken lines in FIG. 14 is found.

By way of an illustrative example of multiplication coefficients or filter coefficients of the respective filters of the convolution filter circuit 703, if the coefficient of a multiplier M for an arbitrary band is 1, outputs of the delay elements are multiplied by coefficients 0.15, 0.0019, 0.0000086, 0.4, 0.06 and 0.007 at the multipliers M−1, M−2, M−3, M+1, M+2 and M+3, M being an arbitrary integer of from 1 to 25, for performing convolution of the spectral components SB.

An output of the convolution filter circuit 703 is transmitted to a subtractor 704 which is employed for finding a level $\alpha$ corresponding to the allowable noise level in the convolved region. Meanwhile, the allowable noise level $\alpha$ is such a level which will give an allowable noise level for each of the critical bands by deconvolution as will be described subsequently. The subtractor 704 is supplied with an allowance function (a function representative of the masking level) for finding the level $\alpha$. The level $\alpha$ is controlled by increasing or decreasing the allowance function. The allowance function is supplied from a (N−ai) function generator 25 as will be explained subsequently.

That is, the level $\alpha$ corresponding to the allowable noise level is found from the equation (1):

$$\alpha = S - (n - ai) \tag{15}$$

where $i$ is the number accorded sequentially to the critical bands beginning from the lower side, $n$ and $a$ are constants where a>0, and S the intensity of the convolved Bark spectrum. In the equation (1), (n−ai) represents the allowance function. In the present embodiment, by setting so that n=38 and a=1, optimum encoding may be achieved without deterioration in the sound quality.

The level $\alpha$ is found in this manner and transmitted to a divider 706 for deconvolving the level $\alpha$ in the convolved region. By this deconvolution, the masking spectrum is found from the level $\alpha$. This masking spectrum becomes the allowable noise level. Although the deconvolution necessitates complex arithmetic-logical steps, it is performed in the present embodiment in simplified manner by using the divider 26.

The masking spectrum is transmitted via a synthesizing circuit 207 to a subtractor 708 which is supplied with an output of the band-based energy detection circuit 702, that is the above-mentioned spectral components SB. The subtractor 708 subtracts the masking spectrum from the spectrum SB for masking the portions of the spectral components SB lower than the level of the masking spectrum.

An output of the subtractor 708 is outputted via an allowable noise correction circuit 710 at an output terminal 711 so as to be transmitted to a ROM, not shown, in which the information concerning the number of the allocated bits is stored previously. The ROM outputs the information concerning the number of allocated bits for each band, depending on an output of the subtraction circuit 708 supplied via an allowable noise correction circuit 710. The information concerning the number of the allocated bits is transmitted to the adaptive bit allocation and encoding circuits 210 to 212 to permit the frequency-domain spectral data from the MDCT circuits 203 to 205 to be quantized with the numbers of bits allocated to the respective bands.

In sum, the adaptive bit allocation and encoding circuits 210 to 212 quantize the band-based spectral data with the numbers of bits allocated depending the signal energy in the respective bands and the amount of masking. The delay circuit 709 is employed for delaying the spectral components SB from the energy detection circuit 702 in consideration of the delay produced in the circuitry upstream of the synthesizing circuit 707.

The synthesizing circuit 707 may also be designed to synthesize the masking spectrum MS and data from the minimum audibility curve RC from the minimum audibility curve generating circuit 712 representing psychoacoustic characteristics of the human hearing system as shown in FIG. 9. If the absolute noise level is lower than the minimum audibility curve RC, the noise becomes inaudible. The minimum audibility curve differs with the difference in the playback sound level even although the coding is made in the same manner. However, since there is no marked difference in the manner of the music entering the 16-bit dynamic range in actual digital systems, it may be presumed that, if the quantization noise of the frequency range in the vicinity of 4 kHz most perceptible to the ear is not heard, the quantization noise lower than the level of the minimum audibility curve is not heard in any other frequency range.

Figure 15:
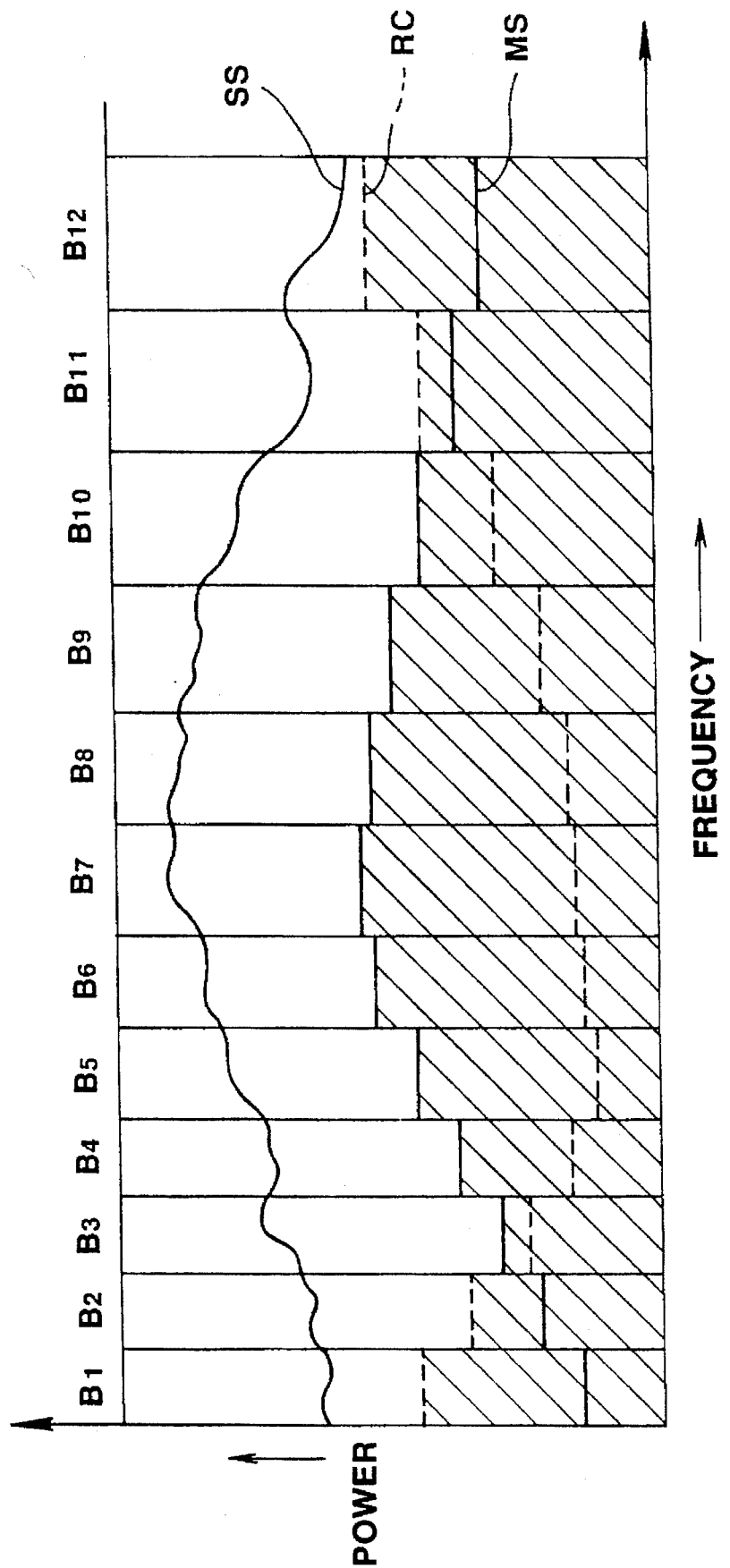
FIG. 15 is a graph combined from the minimum audibility curve and the masking spectrum.

Thus, if the recording/reproducing device is employed so that the noise in the vicinity of 4 kHz is not heard, and the allowable noise level is to be obtained by synthesizing the minimum audibility curve RC and the masking spectrum MS, the allowable noise level may be up to the level indicated by hatched lines in FIG. 15. In the present embodiment, the level of 4 kHz of the minimum audibility curve is matched to the minimum level corresponding to e.g., 20 bits. In FIG. 9, the signal spectrum SS is also shown.

Besides, the allowable noise correction circuit 710 corrects the allowable noise level in the output of the subtractor 708 based on the information of the equal-loudness curve transmitted from a correction information outputting circuit 713. The equal-loudness curve is a characteristic curve concerning psychoacoustic characteristics of the human hearing mechanism, and is obtained by finding the sound pressures of the sound at the respective frequencies heard with the same loudness as the pure tone of 1 kHz and by connecting the sound pressures by a curve. It is also known as an equal loudness sensitivity curve. The equal-loudness curve also delineates a curve which is substantially the same as the minimum audibility curve shown in FIG. 15. With the equal-loudness curve, the sound in the vicinity of 4 kHz is heard with the same loudness as the sound of 1 kHz, even although the sound pressure is decreased by 8 to 10 dB from the sound of 1 kHz. Conversely, the sound in the vicinity of 10 kHz cannot be heard with the same loudness as the sound of 1 kHz unless the sound pressure is higher by about 15 dB than that of the sound of 1 kHz. Thus it may be seen that, in the allowable noise correction circuit 30, the allowable noise level preferably has frequency characteristics represented by a curve conforming to the equal-loudness curve. Thus it may be seen that correction of the allowable noise level in consideration of the equal-loudness curve is in conformity to psychoacoustic characteristics of the hearing system.

In addition, the correction information outputting circuit 713 corrects the allowable noise level based upon the error information between the detection output of the output data quantity on the occasion of quantization by the adaptive bit allocation encoding circuits 210, 211, 212 and the target value of the bit rate of the ultimate encoded data. There are occasions wherein the total number of bits as obtained by temporary adaptive bit allocation for the totality of the bit allocation unit blocks is different from the pre-set number of bits (target number of the bits) as determined by the bit rate of the ultimate encoded output data and hence the re-allocation of bits is again performed so that the difference becomes equal to zero. That is, if the total number of allocated bits is less than the target number of the bits, the bits corresponding to the difference are allocated to the respective unit blocks in an additive manner, whereas, if the total number of allocated bits is larger than the target number of the bits, the bits corresponding to the difference are allocated to the respective unit blocks in a subtractive manner.

Specifically, an error from the target number of the total number of allocated bits is detected and correction data for correcting the number of allocated bits is outputted by the correction information output circuit 713 depending on the error data. If the error data indicates the shortage of the number of bits, it is probable that a large number of bits are employed per unit block so that the amount of the data is in excess of the target number of bits. If the error data indicates an excess of the number of bits, it is probable that a smaller number of bits per unit block suffices so that the amount of the data is less than the target number. Consequently, the correction information output circuit 713 is responsive to the error data to output data of correction values by which the allowable noise level at an output of the subtractor 708 is to be corrected based upon the information of the equal-loudness curve. The correction values are transmitted to the allowable noise correction circuit 710 for correcting the allowable noise from the subtractor 708. With the above-described system, quantized spectral data is outputted as the main information, while the scale factor indicating the state of block floating or the word length data are routed as the subsidiary information from the encoder to the decoder.

Figure 16:
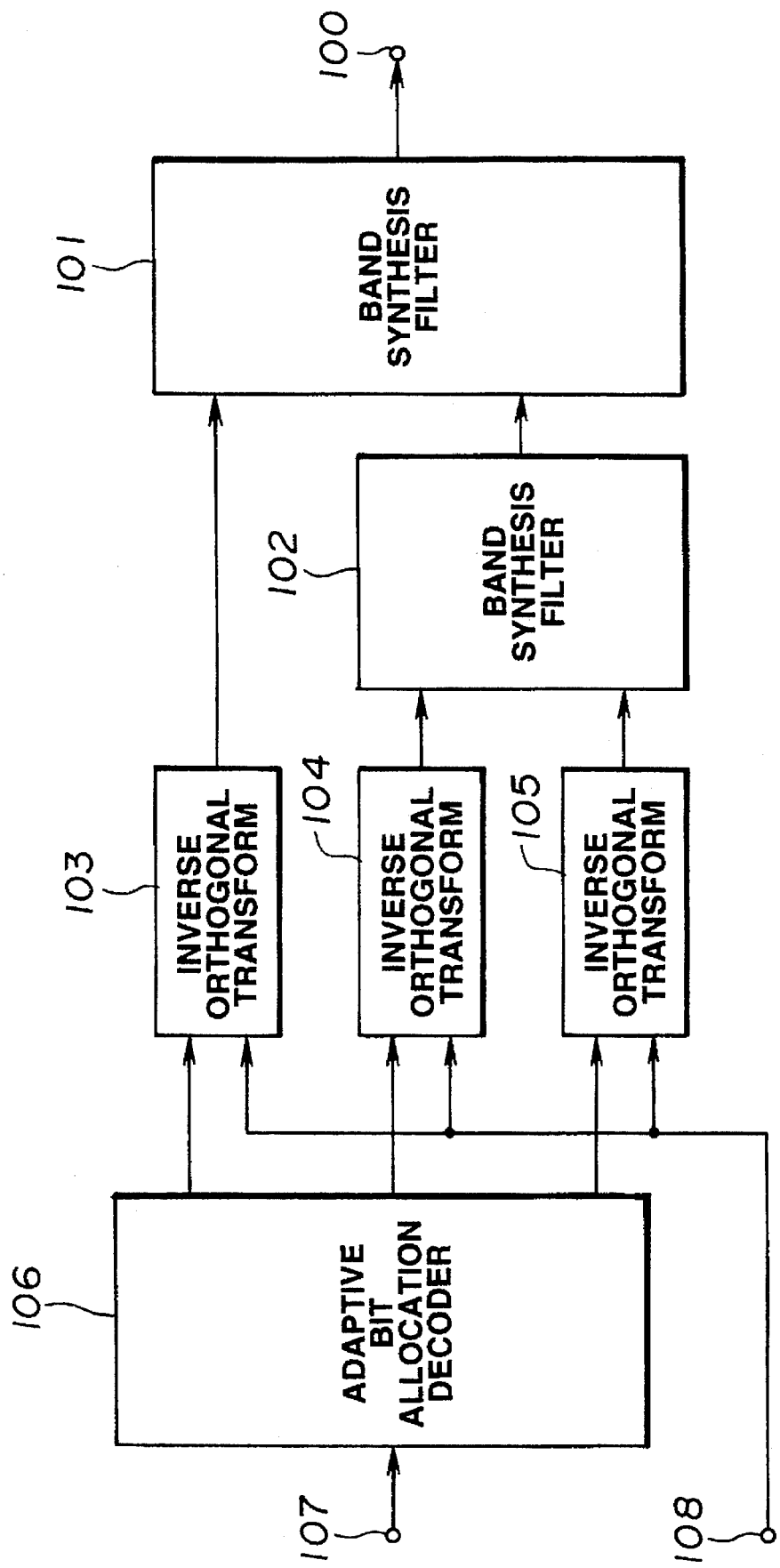
FIG. 16 is a block circuit diagram showing an illustrative example of a high efficiency encoding circuit that may be used in bit rate compression for the embodiment of FIG. 1.

FIG. 16 shows the ATC decoder 73, that is a decoding circuit for decoding the signal encoded with high efficiency encoding as described above. The quantized MDCT coefficients of the respective bands, that is data equivalent to output signals at respective output terminals 213, 214 and 215 of FIG. 2, are routed to an input of a decoding circuit 107, while the information on the block sizes employed and the information equivalent to output signals on the frequency-based length of the mini-block for block floating and quantization, that is data equivalent to output signals at the output terminals 216, 217 and 218 in FIG. 2, are supplied to an input terminal 108. An adaptive bit allocation decoding circuit 106 cancels bit allocation using the adaptive bit allocation information. The inverse orthogonal transform (IMDCT) circuits 103, 104 and 105 convert the frequency-domain signals into time-domain signals. These partial-band time-domain signals are decoded by band-synthesis filter (IQMF) circuits 102, 101 into full-band signals.

The present invention is not limited to the above-described illustrative embodiment. For example, the recording/reproducing apparatus, signal encoder or the signal decoder need not be of a unified construction, but may be separate components interconnected by a data transmission network, optical cables or communication by light or electrical waves without interposition of a recording medium. In addition, the signal encoder of the present invention may be applied to a processing apparatus for digital speech signals or digital video signals, in addition of the audio PCM signals.

The recording medium according to the present invention may be used for recording data encoded by the digital signal encoder for effectively utilizing its recording capacity. In addition, the recording medium of the present invention may be comprised of a magnetic disc, an IC memory, a card enclosing the memory or a magnetic tape, in place of the above-described optical disc.

What is claimed is:

1. A method for compressing digital signals comprising the steps of:

dividing an input signal into at least two bands;

obtaining frequency-domain data of said at least two bands of the input signal; and acting on at least one characteristic of said frequency domain data;

wherein said step of acting on at least one characteristic acts on frequency-domain characteristics and includes:

a multiplication coefficient calculating sub-step of calculating the size of frequency-domain spectral data, allocating the frequency characteristic operating information on said spectral data for normalization and outputting coefficients for multiplication;

an overflow check sub-step of checking whether or not a result of multiplication of said spectral data with the multiplication coefficient supplied from said multiplication coefficient calculating sub-step exceeds a pre-set upper limit;

a coefficient correcting step of normalizing the coefficients from said multiplication coefficient calculating sub-step in their entirety if, judging from an output of said overflow check sub-step, there are a large number of frequency domain spectral data for which occurs the overflow;

a storage step of correcting the coefficients so that an output of said coefficient correction sub-step will exhibit moderate changes;

an aliasing noise reducing sub-step of correcting an output of said coefficient correcting sub-step to characteristics maintaining symmetry with respect to a cut-off frequency as an axis of symmetry for canceling previous aliasing noise; and a multiplication sub-step of multiplying the coefficients corrected by said aliasing noise reducing sub-step with the frequency-domain spectral data.

2. The method as claimed in claim 1 wherein said step of dividing an input signal into at least two bands uses a QMF filter made up at least of a low-pass filter and a high-pass filter and said step of acting on at least one characteristic affords such characteristics that the equation $$F_1^2(w) + F_1^2\left(w + \frac{W_s}{2}\right) = 1 \qquad (14)$$

is satisfied, an impulse response of the high-pass filter will meet the equation:

$$g_1(n) = f_1(n) \qquad 0 \leq n \leq L-1 \qquad (8)$$
$$g_2(n) = -(-1)^n f_1(n) \quad 0 \leq n \leq L-1$$

and impulse responses g1, g2 of synthesis filters G1, G2 will meet the equation:

$$t_1(n) = \sum_{k=0}^{L-1} g_1(k) u_1(n-k) \qquad (9)$$

$$t_2(n) = \sum_{k=0}^{L-1} g_2(k) u_2(n-k)$$

where f1 (n) is an impulse response of the low-pass filter and F1(n) its z-transform.

3. The method as claimed in claim 1, wherein the cut-off frequency is fs/4.

4. The method as claimed in claim 1, wherein said step of acting on at least one characteristic achieves pre-set characteristics by changing the condition of canceling the frequency-domain characteristics and the aliasing noise.

5. The method as claimed in claim 4, wherein the cut-off frequency is fs/4.

6. The method as claimed in claim 1, wherein said step of acting on at least one characteristic places priority on operating on the frequency-domain characteristics rather than on the condition of canceling the aliasing noise in the high range.

7. The method as claimed in claim 6, wherein the cut-off frequency is fs/4.

8. A recording medium having recorded thereon signals formed by the digital signal compressing method as claimed in any one of claims 1 to 2.

9. A method for compressing digital signals comprising the steps of:
dividing an input signal into at least two bands;
obtaining frequency-domain data of said at least two bands of the input signal; and
acting on at least one characteristic of said frequency domain data;
wherein said step of acting on at least one characteristic acts on frequency-domain characteristics for maintaining the condition of canceling aliasing noise that results from the frequency division;
wherein said step of acting on at least one characteristic includes:
a multiplication coefficient calculating sub-step of calculating the size of frequency-domain spectral data, allocating the frequency characteristic operating information on said spectral data for normalization and outputting coefficients for multiplication;
an overflow check sub-step of checking whether or not a result of multiplication of said spectral data with the multiplication coefficient supplied from said multiplication coefficient calculating sub-step exceeds a pre-set upper limit;
a coefficient correcting step of normalizing the coefficients from said multiplication coefficient calculating sub-step in their entirety if, judging from an output of said overflow check sub-step, there are a large number of frequency domain spectral data for which occurs the overflow;
a storage step of correcting the coefficients so that an output of said coefficient correction sub-step will exhibit moderate changes;
an aliasing noise reducing sub-step of correcting an output of said coefficient correcting sub-step to characteristics maintaining symmetry with respect to a cut-off frequency fs/4 as an axis of symmetry for canceling previous aliasing noise; and
a multiplication sub-step of multiplying the coefficients corrected by said aliasing noise reducing sub-step with the frequency-domain spectral data and
wherein said step of dividing an input signal into at least two bands uses a QMF filter made up at least of a low-pass filter and a high-pass filter and said step of acting on at least one characteristic affords such characteristics that the equation $$F_1^2(w) + F_1^2\left(w + \frac{W_s}{2}\right) = 1 \qquad (14)$$

is satisfied, an impulse response of the high-pass filter will meet the equation:

$$g_1(n) = f_1(n) \qquad 0 \leq n \leq L-1 \qquad (8)$$
$$g_2(n) = -(-1)^n f_1(n) \quad 0 \leq n \leq L-1$$

and impulse responses g1, g2 of synthesis filters G1, G2 will meet the equation:

$$t_1(n) = \sum_{k=0}^{L-1} g_1(k) u_1(n-k) \qquad (9)$$

$$t_2(n) = \sum_{k=0}^{L-1} g_2(k) u_2(n-k)$$

where f1 (n) is an impulse response of the low-pass filter and F1(n) its z-transform.

10. The method as claimed in claim 9 wherein said step of acting on at least one characteristic achieves pre-set characteristics by changing the condition of canceling the frequency-domain characteristics and the aliasing noise.

11. The method as claimed in claim 9 wherein said step of acting on at least one characteristic places priority on operating on the frequency-domain characteristics rather than on the condition of canceling the aliasing noise in the high range.

12. A recording medium having recorded thereon signals formed by the digital signal compressing method as claimed in any one of claims 9 to 11.

13. A device for compressing digital signals comprising:
means for dividing an input signal into at least two bands;
means for obtaining frequency-domain data of said at least two bands of the input signal; and
means for acting on at least one characteristic of said frequency-domain data; wherein said means for acting on at least one characteristic acts on frequency-domain characteristics for maintaining the condition of canceling the aliasing noise that results from the frequency division
wherein said means for acting on at least one characteristic includes:
a multiplication coefficient calculating circuit for calculating the size of frequency-domain spectral data, allocating the frequency characteristic operating information on said spectral data for normalization and outputting coefficients for multiplication;
an overflow check circuit for checking whether or not a result of multiplication of said spectral data with the multiplication coefficient supplied from said multiplication coefficient calculating means exceeds a pre-set upper limit;

a coefficient correcting circuit for normalizing the coefficients from said multiplication coefficient calculating means in their entirety if, judging from an output of said overflow check sub-step, there are a large number of frequency domain spectral data for which occurs the overflow;

a memory for correcting the coefficients so that an output of said coefficient correction means will exhibit moderate changes; an aliasing noise reducing circuit for correcting an output of said coefficient correcting means to characteristics maintaining symmetry with respect to a cut-off frequency as an axis of symmetry for canceling previous aliasing noise; and a multiplier for multiplying the coefficients corrected by said aliasing noise reducing means with the frequency-domain spectral data.

14. The device as claimed in claim 13 wherein said means for dividing an input signal into at least two bands uses a QMF filter made up at least of a low-pass filter and a high-pass filter and said means for acting on at least one characteristic affords such characteristics that the equation $$F_1^2(w) + F_1^2\left(w + \frac{W_s}{2}\right) = 1 \tag{14}$$

is satisfied, an impulse response of the high-pass filter will meet the equation:

$$g_1(n) = f_1(n) \qquad 0 \leq n \leq L-1 \tag{8}$$
$$g_2(n) = -(-1)^n f_1(n) \quad 0 \leq n \leq L-1$$

and impulse responses g1, g2 of synthesis filters G1, G2 will meet the equation:

$$t_1(n) = \sum_{k=0}^{L-1} g_1(k) u_1(n-k) \tag{9}$$
$$t_2(n) = \sum_{k=0}^{L-1} g_2(k) u_2(n-k)$$

where f1(n) is an impulse response of the low-pass filter and F1(n) its z-transform.

15. The device as claimed in claim 13, wherein said cut-off frequency is fs/4.

16. The device as claimed in claim 13, wherein said means for acting on at least one characteristic achieves pre-set characteristics by changing the condition of canceling the frequency-domain characteristics and the aliasing noise.

17. The device as claimed in claim 16, wherein said cut-off frequency is fs/4.

18. The device as claimed in claim 13, wherein said means for acting on at least one characteristic places priority on operating on the frequency-domain characteristics rather than on the condition of canceling the aliasing noise in the high range.

19. The device as claimed in claim 18, wherein said cut-off frequency is fs/4.

20. A device for compressing digital signals comprising:
means for dividing an input signal into at least two bands;
means for obtaining frequency-domain data of said at least two bands of the input signal; and
means for acting on at least one characteristic of said frequency-domain data; wherein said means for acting on at least one characteristic acts on frequency-domain characteristics for maintaining the condition of canceling aliasing noise by the frequency division, wherein said means for dividing an input signal into at least two bands uses a QMF filter made up at least of a low-pass filter and a high-pass filter and said means for acting on at least one characteristic affords such characteristics that the equation $$F_1^2(w) + F_1^2\left(w + \frac{W_s}{2}\right) = 1 \tag{14}$$

is satisfied, an impulse response of the high-pass filter will meet the equation:

$$g_1(n) = f_1(n) \qquad 0 \leq n \leq L-1 \tag{8}$$
$$g_2(n) = -(-1)^n f_1(n) \quad 0 \leq n \leq L-1$$

and impulse responses g1, g2 of synthesis filters G1, G2 will meet the equation:

$$t_1(n) = \sum_{k=0}^{L-1} g_1(k) u_1(n-k) \tag{9}$$
$$t_2(n) = \sum_{k=0}^{L-1} g_2(k) u_2(n-k)$$

where f1(n) is an impulse response of the low-pass filter and F1(n) its z-transform; and wherein said means for acting on at least one characteristic includes:

a multiplication coefficient calculating circuit for calculating the size of frequency-domain spectral data, allocating the frequency characteristic operating information on said spectral data for normalization and outputting coefficients for multiplication;

an overflow check circuit for checking whether or not a result of multiplication of said spectral data with the multiplication coefficient supplied from said multiplication coefficient calculating means exceeds a pre-set upper limit;

a coefficient correcting circuit for normalizing the coefficients from said multiplication coefficient calculating means in their entirety if, judging from an output of said overflow check sub-step, there are a large number of frequency domain spectral data for which occurs the overflow;

a memory for correcting the coefficients so that an output of said coefficient correction means will exhibit moderate changes; an aliasing noise reducing circuit for correcting an output of said coefficient correcting means to characteristics maintaining symmetry with respect to a cut-off frequency as an axis of symmetry for canceling previous aliasing noise; and a multiplier for multiplying the coefficients corrected by said aliasing noise reducing means with the frequency-domain spectral data.

21. The device as claimed in claim 20 wherein said means for acting on at least one characteristic achieves pre-set characteristics by changing the condition of canceling the frequency-domain characteristics and the aliasing noise.

22. The device as claimed in claim 21 wherein said means for acting on at least one characteristic places priority on operating on the frequency-domain characteristics rather than on the condition of canceling the aliasing noise in the high range.

* * * * *